United States Patent
Salus et al.

(10) Patent No.: US 12,166,414 B2
(45) Date of Patent: Dec. 10, 2024

(54) DEVICE, SYSTEM AND METHOD TO DETERMINE AN OPERATIONAL MODE OF A CONTINUOUS CAPACITIVE VOLTAGE REGULATOR

(71) Applicant: Intel Corporation, Santa Clara, CA (US)

(72) Inventors: Tamir Salus, Zichron Yaakov (IL); Nicolas Butzen, Portland, OR (US); Arvind Raghavan, Lexington, MA (US); Harish Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 17/711,461

(22) Filed: Apr. 1, 2022

(65) Prior Publication Data
US 2023/0318448 A1   Oct. 5, 2023

(51) Int. Cl.
*H02M 3/07* (2006.01)
*G01R 19/25* (2006.01)

(52) U.S. Cl.
CPC .............. *H02M 3/07* (2013.01); *G01R 19/25* (2013.01)

(58) Field of Classification Search
CPC .............................................. H02M 3/07–073
See application file for complete search history.

(56) References Cited

U.S. PATENT DOCUMENTS

| | | | |
|---|---|---|---|
| 8,120,934 B2 | 2/2012 | Pauritsch et al. | |
| 9,389,628 B2 * | 7/2016 | Herbison | H02M 3/157 |
| 10,958,079 B2 * | 3/2021 | Liu | H02M 1/10 |
| 2017/0222538 A1 * | 8/2017 | Jung | H02M 3/07 |
| 2018/0102767 A1 * | 4/2018 | Hsieh | H03K 5/00006 |
| 2018/0212521 A1 * | 7/2018 | Hsieh | H02M 1/32 |

(Continued)

FOREIGN PATENT DOCUMENTS

| | | | | |
|---|---|---|---|---|
| CN | 112789798 A | * | 5/2021 | H02M 1/0045 |
| EP | 2816719 A2 | * | 12/2014 | |

(Continued)

OTHER PUBLICATIONS

Extended European Search Report, EP App. No. 23150387.1, Jul. 24, 2023, 10 pages.

(Continued)

*Primary Examiner* — Sisay G Tiku
(74) *Attorney, Agent, or Firm* — NICHOLSON DE VOS WEBSTER & ELLIOTT LLP

(57) ABSTRACT

Techniques and mechanisms for determining a mode of operation of a switched capacitor voltage regulator (SCVR). In an embodiment, a controller supports multiple modes of operation of the SCVR, wherein the modes each correspond to a different respective sequence of switch states of a converter core of the SCVR. One of the modes is to provide boost voltage regulation with the SCVR. The controller transitions seamlessly and autonomously between two modes based on respective reference switch states of the two modes. In another embodiment, a mode transition is performed based on a signal which a control sensor generates based on a rate of switch events of the voltage regulator, and predetermined reference information indicating current characteristics of the voltage regulator.

18 Claims, 13 Drawing Sheets

(56) References Cited

U.S. PATENT DOCUMENTS

| | | | |
|---|---|---|---|
| 2020/0144908 A1* | 5/2020 | Meyvaert | H02M 3/158 |
| 2020/0350817 A1* | 11/2020 | De | H02M 3/155 |
| 2021/0408901 A1* | 12/2021 | Li | H02M 1/0045 |
| 2022/0065901 A1* | 3/2022 | Desai | H03F 3/45748 |
| 2022/0255429 A1* | 8/2022 | Chen | H02M 3/07 |
| 2022/0352816 A1* | 11/2022 | Liu | H02M 3/07 |
| 2022/0376623 A1* | 11/2022 | Singh | H02M 1/0048 |
| 2023/0128793 A1* | 4/2023 | Chen | H02M 3/158 363/69 |
| 2023/0139978 A1* | 5/2023 | Carobolante | H02M 3/07 323/234 |
| 2023/0163684 A1* | 5/2023 | Liu | H02M 1/0054 363/60 |
| 2023/0198384 A1* | 6/2023 | Butzen | H02M 3/07 323/271 |
| 2023/0216409 A1* | 7/2023 | Ravi | H02M 3/158 323/282 |
| 2023/0336078 A1* | 10/2023 | Bertolini | H02M 7/4833 |

FOREIGN PATENT DOCUMENTS

| | | | |
|---|---|---|---|
| KR | 20220059061 A | * | 5/2022 |
| TW | I790870 B | * | 1/2023 |
| WO | WO-2023226452 A1 | * | 11/2023 |
| WO | WO-2023230920 A1 | * | 12/2023 |
| WO | WO-2024025236 A1 | * | 2/2024 |

OTHER PUBLICATIONS

Butzen, Nicolas, et al., "A Single-Topology Continuously-Scalable-Conversion-Ratio Fully Integrated Switched-Capacitor DC-DC Converter with 0-to-2.22V Output and 93% Peak-Efficiency", 2018 Symposium on VLSI Circuits Digest of Technical Papers, 2 pgs.

Butzen, Nicolas, et al., "Design of Single-Topology Continuously Scalable-Conversion-Ratio Switched-Capacitor DC-DC Converters", IEEE Journal of Solid-State Circuits, vol. 54, No. 4, Apr. 2019, 9 pgs.

* cited by examiner

700

|        | 0    | 1    | 2    | 3    | 4    | 5    | 6    | 7    |
|--------|------|------|------|------|------|------|------|------|
|        | DSO  | N4O  | N3O  | N2O  | N1O  | M3O  | M2O  | M1O  |
| Top    | Vout | Vout | Vout | Vout | Vout | T3   | T2   | T1   |
| Bottom | Vss  | B4   | B3   | B2   | B1   | Vout | Vout | Vout |

|        | 8    | 9    | 10   | 11   | 12   | 13   | 14   | 15   |
|--------|------|------|------|------|------|------|------|------|
|        | DIO  | N1I  | N2I  | N3I  | N4I  | M1S  | M2S  | M3S  |
| Top    | Vin  | Vin  | Vin  | Vin  | Vin  | T1   | T2   | T3   |
| Bottom | Vout | B1   | B2   | B3   | B4   | Vss  | Vss  | Vss  |

|        | 0    | 1    | 2    | 3    | 4    | 5    | 6    | 7    |
|--------|------|------|------|------|------|------|------|------|
|        | DOI  | M3I  | M2I  | M1I  | N1I  | N2I  | N3I  | N4I  |
| Top    | Vout | T3   | T2   | T1   | Vin  | Vin  | Vin  | Vin  |
| Bottom | Vin  | Vin  | Vin  | Vin  | B1   | B2   | B3   | B4   |

|        | 8    | 9    | 10   | 11   | 12   | 13   | 14   | 15   |
|--------|------|------|------|------|------|------|------|------|
|        | DIS  | M1S  | M2S  | M3S  | N4O  | N3O  | N2O  | N1O  |
| Top    | Vin  | T1   | T2   | T3   | Vout | Vout | Vout | Vout |
| Bottom | Vss  | Vss  | Vss  | Vss  | B4   | B3   | B2   | B1   |

|        | 0    | 1    | 2      | 3     | 4     | 5     |
|--------|------|------|--------|-------|-------|-------|
|        | DSO  | N34O | N12O   | M3O   | M2O   | M1O   |
| Top    | Vout | Vout | Vout   | T3    | T2    | T1    |
| Bottom | Vss  | B3, B4 | B1, B2 | Vout | Vout  | Vout  |

|        | 6    | 7      | 8      | 9    | 10   | 11   |
|--------|------|--------|--------|------|------|------|
|        | DIO  | N12I   | N34I   | M1S  | M2S  | M3S  |
| Top    | Vin  | Vin    | Vin    | T1   | T2   | T3   |
| Bottom | Vout | B1, B2 | B3, B4 | Vss  | Vss  | Vss  |

|        | 0    | 1     | 2    | 3    | 4    | 5    |
|--------|------|-------|------|------|------|------|
|        | DIS  | M123S | N4O  | N3O  | N2O  | N1O  |
| Top    | Vin  | T1-T3 | Vout | Vout | Vout | Vout |
| Bottom | Vss  | Vss   | B4   | B3   | B2   | B1   |

|        | 6    | 7     | 8    | 9    | 10   | 11   |
|--------|------|-------|------|------|------|------|
|        | DOI  | M123I | N1I  | N2I  | N3I  | N4I  |
| Top    | Vout | T1-T3 | Vin  | Vin  | Vin  | Vin  |
| Bottom | Vin  | Vin   | B1   | B2   | B3   | B4   |

|        | 0   | 1       | 2       | 3     | 4    | 5      | 6       | 7     |
|--------|-----|---------|---------|-------|------|--------|---------|-------|
|        | DSO | N34O    | N12O    | M123O | DIO  | N12I   | N34I    | M123S |
| Top    | Vout| Vout    | Vout    | T1-T3 | Vin  | Vin    | Vin     | T1-T3 |
| Bottom | Vss | B3, B4  | B1, B2  | Vout  | Vout | B1, B2 | B3, B4  | Vss   |

FIG. 7E

DEVICE, SYSTEM AND METHOD TO DETERMINE AN OPERATIONAL MODE OF A CONTINUOUS CAPACITIVE VOLTAGE REGULATOR

BACKGROUND

1. Technical Field

This disclosure generally relates to voltage converter circuitry and more particularly, but not exclusively, to operation of a voltage converter which supports a dynamic transition between any of various regulation modes.

2. Background Art

A switched capacitor voltage regulator (SCVR)—such as a continuous capacitive voltage regulator (sometimes referred to as a "continuously scalable conversion ratio voltage regulator")—is one type of regulator technology which provides space and cost efficiencies due to their primary reliance on using only circuitry capacitors and switches. These regulator technologies traditionally supports various buck (or "step down") voltage regulation modes wherein an input voltage (Vin) is higher than a resulting output voltage (Vout). However, transitions between voltage regulation modes is typically done statically—wherein a VR needs to be turned off and then back on—based on a predicted workload, voltage, current and/or other requirement. Such VR mode transitions have been based on expected future requirements, due to a lack of an ability to dynamically transition between modes during continuous VR operation.

As continuous performance systems continue to increase in number and variety, there is expected to be an increasing premium placed on improvements to voltage regulation solutions.

BRIEF DESCRIPTION OF THE DRAWINGS

The various embodiments of the present invention are illustrated by way of example, and not by way of limitation, in the figures of the accompanying drawings and in which:

FIGS. 7A through 7E show sequence diagrams each illustrating respective modes of a switched capacitor voltage regulator according to a corresponding embodiment.

DETAILED DESCRIPTION

Figure 1:
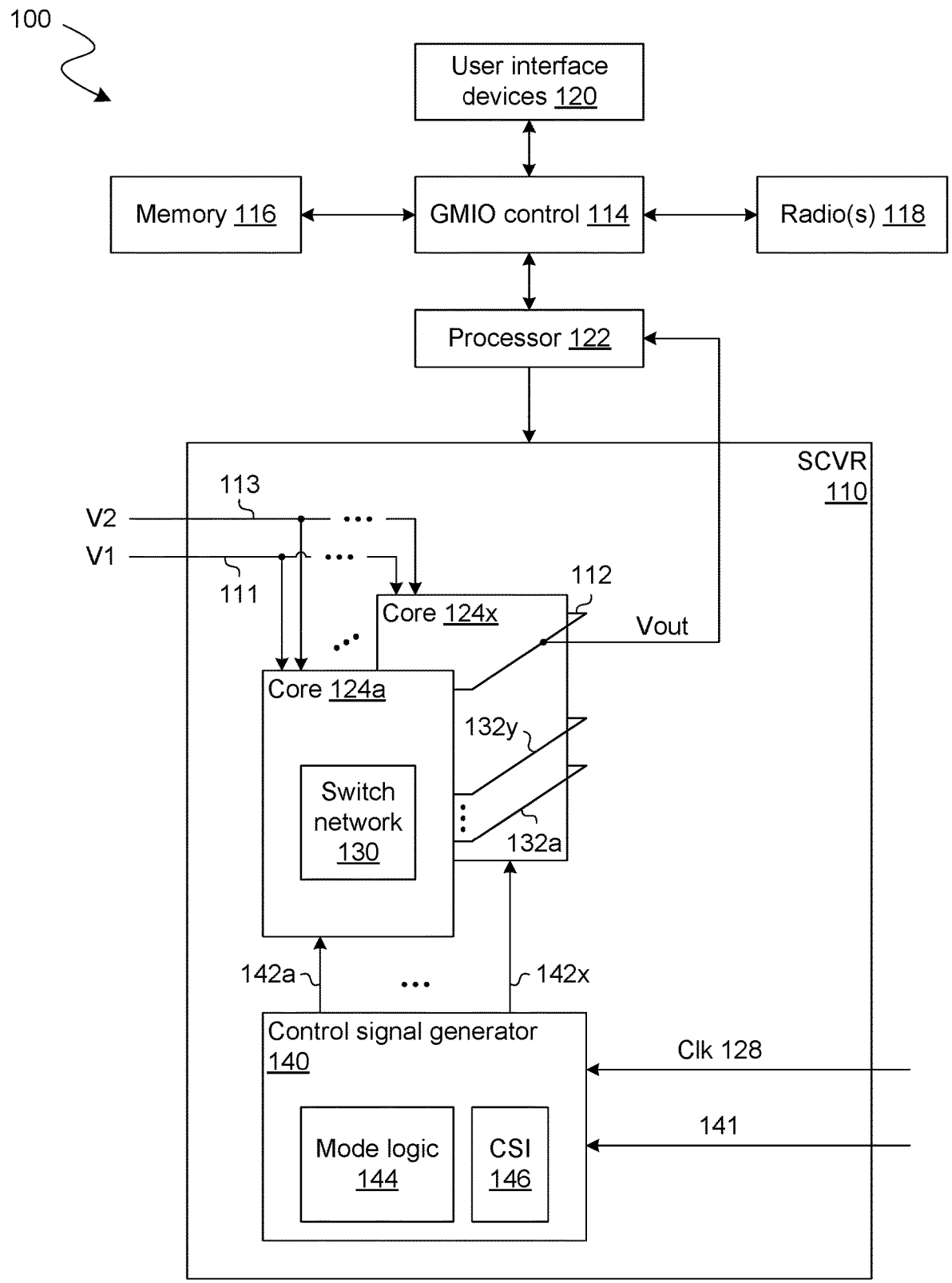
FIG. 1 shows a functional block diagram illustrating features of a system to provide a regulated voltage according to an embodiment.

Some embodiments variously provide structures of, and/or operations with, a switched capacitor voltage converter which comprises multiple circuits—variously referred to herein as "converter cores," or simply "cores"—that are coupled in parallel with each other via multiple buses. In various embodiments, the multiple buses comprise a first bus, which is to receive an input voltage, and a second bus which is to provide an output voltage generated by the SC voltage converter based on said input voltage. In one such embodiment, the multiple buses further comprise a first one or more buses which are each to function as a respective charge redistribution bus (CRB). In this context, "charge redistribution bus" refers herein to a bus which is to conduct charges between two cores—e.g., wherein the bus is other than any by which a switched capacitor (SC) voltage converter is to receive a particular input voltage, or provide a particular output voltage (such as one of a supply voltage, a ground potential, or the like).

A given converter core according to some embodiments comprises a capacitor, and a first switch network which is coupled between the capacitor and various ones of the multiple buses. For example, such a switch network comprises switch circuits which are configured to facilitate the selective provisioning of one or more conductive paths each between the capacitor and a different respective bus of the multiple buses. In some embodiments, the core further comprises a second switch network which is also coupled to the capacitor—e.g., wherein the first switch network and the second switch network are coupled to the capacitor via different respective terminals thereof.

Operation of a SC voltage converter enables high-efficiency regulation of an output voltage, but (for example) tends to have a significant current output penalty. To realize these regulation efficiencies, a switched capacitor voltage regulator (SCVR) is traditionally designed and operated to provide a large total number (P) of charge redistribution phases, as well as number of time-interleaved converter cells. Given a fixed control frequency, the output current of such a SCVR tends to be inversely proportionate to the number P.

Traditional SCVR operations variously provide "buck" (or step down) voltage regulation wherein an input voltage (Vin) received by the SCVR is greater than an output voltage (Vout) which the SCVR generates based on the voltage Vin. Typically, the provisioning of such a voltage Vout is interrupted or otherwise inconsistent during a transition between a mode for providing some first type of voltage regulation with a SCVR, and another mode for providing some different type of voltage regulation with that SCVR.

By contrast, various embodiments provide circuitry and/or other logic to accommodate any of multiple modes for controlling operation of a SC converter circuit. One such mode provides "boost" voltage regulation, for example, wherein an input voltage (Vin) received by the SCVR is less than an output voltage (Vout) which the SCVR generates based on the voltage Vin. Additionally or alternatively, the multiple modes comprise one or more "turbo" modes. As used herein, a "turbo mode" refers to a mode which is to provide a sequence of switch states, wherein the sequence is relatively small, as compared to a sequence of switch states which is provided by another one of the plurality of modes. For example, some or all modes each correspond to a different respective number P. Some embodiments variously facilitate a signal generation and/or control schema which enables a total number of intermediate soft-charging phases—and thus, the number P—to be selectively configured (e.g., reconfigured). For example, such (re)configuration is performed statically—e.g., using one or more configure bits or other suitable control parameters—or dynamically using a monitor and reconfiguration control loop.

By making the phase number P configurable, some embodiments variously enable operation of a SCVR in one mode which uses a relatively low P number—e.g., for a relatively high output current—to extend a current capability of the SCVR. In some embodiments, a given intermediate soft-charging phase in such a mode uses a combination of respective circuit paths which are used in multiple intermediate soft-charging phases of a different mode. This effectively merges the multiple phases—e.g., to reduce the RC time constant of the used circuit paths, further improving current capability.

In some embodiments, a number of soft-charging phases is reconfigured based on input voltage and/or an output voltage at a SCVR. For example, such reconfiguration is able to accommodate for instances where soft-charging phases at a capacitor's top side have reduced impact when the output voltage is high, and/or where soft-charging phases at the capacitor's bottom side have reduced impact when the output voltage is low.

In various embodiments, control logic supports a plurality of modes for operating a SCVR, wherein the modes comprise a boost mode, a buck mode, and (for example) one or more turbo modes. In various embodiments, the control logic is able to additionally or alternatively configure a bypass switch state of the SCVR, wherein the voltage Vin is coupled via a switch network of the SCVR to be provided as the output voltage.

Some embodiments additionally or alternatively provide one or more seamless transitions each between a respective two modes according to which the SCVR is operated. In one such embodiment, one given mode implements a sequence of switch states of the SCVR, wherein one of the switch states is designated ahead of time as a reference switch state to determine how the SCVR is to be transitioned between operation according to the that one given mode, and operation according to a different mode. For each of these one or more mode transitions, a level of voltage Vout is substantially continuous throughout said transition.

Additionally or autonomously, such one or more mode transitions are performed autonomously based on an actual, or expected future, change to one or more characteristics of a power requirement—e.g., the one or more characteristics including a workload, a voltage requirement, a current requirement, and/or the like. In one such embodiment, a mode transition is performed based on a current sensor which operates based on some predetermined digital data which specifies or otherwise indicates a relationship of a current conducted by a SCVR, to a rate of switch events by that SCVR.

FIG. 1 shows features of a system 100 to provide a regulated voltage according to an embodiment. System 100 illustrates one example of an embodiment wherein voltage regulation is provided with multiple cores of a switched capacitor converter circuit, wherein control logic facilitates operation of the multiple cores according to any of multiple configurable modes. In various embodiments, the modes, which each correspond to a different respective sequence of switch states of a given core, comprise a boost mode—e.g., in addition to a buck mode and/or a bypass mode, in some embodiments.

As shown in FIG. 1, system 100 comprises one or more processors 122, a graphics/memory/input/output (GMIO) control 114, a memory 116, a wireless interface/radio 118, and user interface devices 120. For example, system 100 comprises some or all of a computing platform such as that of a test system, design/debug tool, laptop, personal digital assistant (PDA), wireless smart phone, media player, imaging device, or any other suitable apparatus. One or more components of such a platform are to receive power from voltage regulator (VR) circuitry, such as that of the illustrative switched capacitor VR (or "SCVR") 110 shown.

By way of illustration and not limitation, processor 122 is coupled to receive a voltage Vout which is generated by the SCVR 110 of system 100. However, the particular one or more components of system 100 which are to receive power from SCVR 110 are merely illustrative, and in other embodiments, SCVR 110 provides power to any of various additional or alternative components. Some embodiments are provided entirely with circuitry of SCVR 110, and/or entirely with logic (comprising hardware, firmware and/or executing software) which provides functionality to configure a mode of operation of said circuitry.

In the example embodiment shown, processor 122 is coupled to memory 116, radios 118, and user interface devices 120 through GMIO control 114. GMIO control 114 includes one or more blocks (e.g., chips or units within an integrated circuit) to perform various interface control functions (e.g., memory control, graphics control, I/O interface control, and the like). These circuits are implemented, for example, on one or more separate chips, and/or are partially or wholly implemented within a chip comprising processor 122. In various embodiments, SCVR 110 is alternatively implemented within processor 122 or within any of various other such components of system 100.

In some embodiments, memory 116 comprises one or more memory blocks to provide additional RAM to the processor 122. Memory 116 is implemented, for example, with any suitable memory including but not limited to dynamic RAM (DRAM), static RAM (SRAM), flash memory, or the like. In an embodiment, radios 118 wirelessly couple processor 122 to a wireless network (not shown). In some embodiments, user interface devices 120 include one or more devices such as a display, keypad, mouse, etc. to allow a user to interact with and perceive information from the system 100.

The illustrated SCVR 110 comprises multiple circuits—referred to herein as "converter cores" (or, for brevity, simply "cores")—which are coupled in parallel with each other, and which are to function as a switched-capacitor (SC) DC-DC converter. In one such embodiment, a DC input voltage signal/level/potential is received, for example, from a battery (not shown) or other rail source that is included in—or alternatively, is to couple to—system 100. Based on the received input voltage, the converter cores generate an output voltage, which processor core 122 (and/or other circuitry of system 100) uses during operation thereof—e.g., to perform various computing tasks.

By way of illustration and not limitation, SCVR 110 comprises multiple converter cores (such as the illustrative cores 124a, . . . , 124x shown) which are variously coupled to each other via each of multiple buses. The multiple buses comprise a bus 111 which is to receive an input voltage V1, a bus 112 which provides an output voltage Vout, and one or more other buses such as the illustrative charge redistribution buses CRBs 132a, . . . , 132y shown. For example, voltage V1 comprises one of a common collector voltage Vcc, or a source supply voltage Vss.

Cores 124a, . . . , 124x operate in combination with each other, and with the multiple buses, as a voltage converter which generates voltage Vout based on voltage V1. In one such embodiment, the generation of voltage Vout comprises two or more converter cores—e.g., including cores 124a, . . . , 124x—distributing charges via some or all of bus 111, bus 112, and CRBs 132a, . . . , 132y. Such charge redistribution is facilitated at least in part with switch circuits of a given converter core.

By way of illustration and not limitation, a given one of cores 124a, . . . , 124x—in this example embodiment, core 124a—comprises at least one capacitor (not shown), and a switch network 130 comprising switch circuits which are electrically coupled to each other. For example, switch network 130 comprises switches which are variously coupled between a given terminal of the capacitor, and a respective one or more of the multiple buses. Branches of switch network 130 (e.g., the branches each comprising a respective one or more switches) variously extend each to facilitate the selective provisioning of a conductive path between the capacitor and a respective one of the multiple buses.

In various embodiments, SCVR 110 includes—or alternatively, accommodates coupling to—circuitry (such as that of the illustrative control signal generator 140 shown) which generates one or more control signals to operate switch circuits of switch network 130 and/or one or more of any other switch networks of cores 124a, . . . , 124x. For example, control signal generator 140 provides to cores 124a, . . . , 124x respective control signals 142a, . . . , 142x which variously operate switch circuitry of the voltage converter. In one such embodiment, switch network 130 is configured to receive a first one or more control signals (e.g., including the illustrative control signal 142a shown), and based thereon, to selectively provide any of various conductive paths each between a first terminal of the capacitor and a different respective bus of the multiple buses. In some embodiments, some or all of control signals 142a, . . . , 142x are generated based on a clock signal Clk 128 which determines a sequential transitioning of a given one of cores 124a, . . . , 124x between various switch states (or "phases") each comprising a respective combination of states of various switch circuits.

The multiple buses further comprise an additional bus 113 by which cores 124a, . . . , 124x, are to receive another input voltage V2 (e.g., wherein voltages V1, V2 comprise a common collector voltage Vcc and a source supply voltage Vss). In one such embodiment, voltage Vout is generated further based on voltage V2—e.g., wherein core 124a further comprises a second switch network (not shown), and the generating of Vout comprises cores 124a, . . . , 124x further distributing charges with the second switch network. For example, switch network 130 is coupled to the capacitor of core 124a via a first terminal thereof, wherein a second switch network of core 124a is coupled to that same capacitor via a second terminal thereof. Based on a first one or more control signals from control signal generator 140, switch network 130 selectively couples the first terminal to any of a first plurality of buses of the multiple buses. Similarly, based on a second one or more control signals from control signal generator 140, the second switch network selectively couples the second terminal to any of a second plurality of buses of the multiple buses. In one such embodiment, the first plurality of buses comprises bus 111, bus 112, and one or more of CRBs 132a, . . . , 132y—e.g., wherein the second plurality of buses comprises bus 113, bus 112, and a different one or more of CRBs 132a, . . . , 132y.

In various embodiments, successively coupling the capacitor of core 124a to various ones of the multiple buses takes place in combination one or more others of cores 124a, . . . , 124x each similarly coupling respective capacitors to said buses at various times. This enables charges to be variously (re)distributed between capacitors of cores 124a, . . . , 124x to facilitate the generation of voltage Vout based on voltages V1, V2. In one such embodiment, two or more of cores 124a, . . . , 124x each include a respective one or more switch networks, the operation of which exhibits features such as those described herein.

To facilitate efficient voltage regulation according to some embodiments, control signal generator 140 (or other suitable logic which is include in, or is to couple to, system 100) provides functionality to configure any of multiple available modes according to which control signal generator 140 is to control operation of cores 124a, . . . , 124x. While it is operating according to such a mode, control signal generator 140 uses some or all of control signals 142a, 142x to variously transition one or more switch networks—each at a respective one of cores 124a, . . . , 124x—through a respective sequence of switch states.

In this particular context (unless otherwise indicated), "switch state" refers herein to a state of a switch network—e.g., wherein the state comprises a combination of respective "component" switch (sub)states, each of a respective individual switch circuit of the switch network. With respect to an individual switch circuit of such a switch network, "component switch state"—also referred to herein as an "activation state"—is one of an active ("closed circuit") state wherein a conductive path through the switch circuit is enabled, or an inactive ("open circuit") state wherein the conductive path through the switch circuit is disabled. As used herein, "charge redistribution phase" (or simply "phase") refers herein to a period of time during which a given switch state is provided in a sequence of switch states (or "switch state sequence"). It is noted, however, that such use of the term "phase" is to be distinguished from the phase of an individual periodic signal.

In the illustrative embodiment shown, control signal generator 140 includes mode logic 144—comprising hardware, firmware, executing software and/or other suitable logic—which includes or is otherwise operable to access configuration state information (CSI) 146. At a given time, CSI 146 stores one or more configuration parameters which specify or otherwise indicate a mode according to which some or all of control signals 142a, . . . , 142x are to control one or more of cores 124a, . . . , 124x. As described herein, CSI 146 (or other such state of control signal generator 140) is selectively configured—e.g., including reconfigured—based on a configuration signal 141 that (for example) indicates one or more characteristics of power delivery by SCVR 110. Based on CSI 146, mode logic 144 signals a given switch network (at core 124a, for example) to various change the activation states of its respective switch circuits.

In various embodiments, one of the multiple modes of control signal generator 140 (according to which a given one of cores 124a, ..., 124x is to be operated) corresponds to a first sequence of switch states which is to provide a boost voltage regulation with SCVR 110. The first sequence comprises first successive switch states, wherein each of the the first successive switch states is immediately preceded by, or immediately followed by, a respective other one of the first successive switch states in the first sequence. In one such embodiment, bus 112 and some first ones of CRBs 132a, ..., 132y are variously coupled to bus 111—via the switch network 130 and via the capacitor—each during a different respective switch state of the first successive switch states. The first sequence further comprises second successive switch states after the first successive switch states, wherein (for example) bus 113 and some second ones of CRBs 132a, ..., 132y are variously coupled to bus 111—via the switch network 130 and via the capacitor—each during a different respective switch state of the second successive switch states.

Additionally or alternatively, mode logic 144, CSI 146 and/or other circuitry of control signal generator 140 facilitates a transition between a given two modes (a "mode transition" herein) which is based on a reference switch state of a switch state sequence. As used herein "reference switch state" refers to a switch state which has been predesignated as a point of reference for determining when control signal generator 140 (for example) is to be transitioned from one mode for operating SCVR 110. By way of illustration and not limitation, a reference switch state of a given switch state sequence is designated to be a last switch state to be configured before a transition away from a mode which corresponds to that switch state sequence. Alternatively or in addition, the reference switch state is designated to be a first switch state to be configured after a transition to a mode which corresponds to the switch state sequence.

Figure 2:
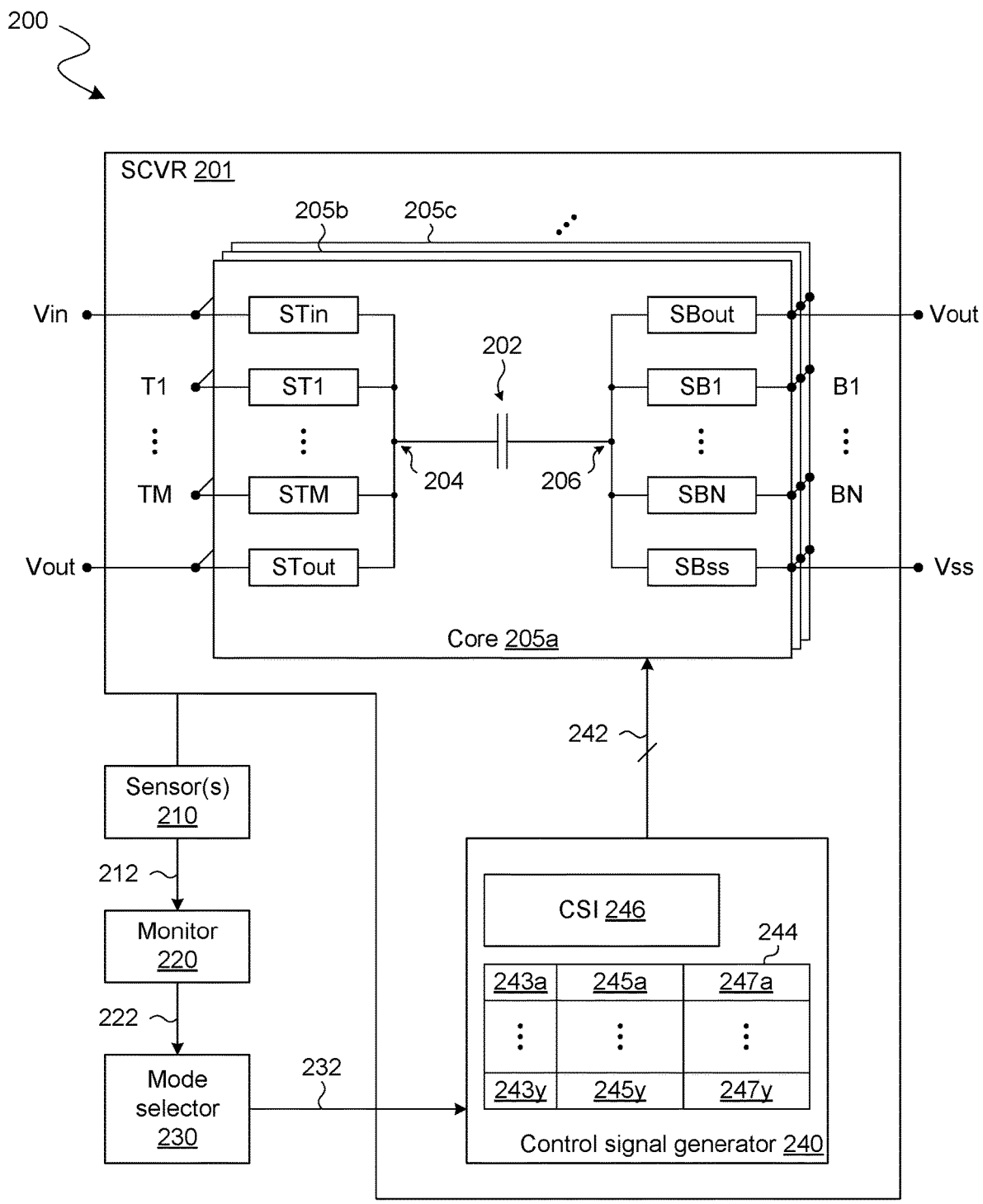
FIG. 2 shows a functional block diagram illustrating features of a system to select one of multiple possible modes to operate a switched capacitor voltage regulator according to an embodiment.

FIG. 2 shows features of a system 200 which is to configure one of multiple available modes for controlling operation of a SCVR according to an embodiment. System 200 illustrates one example of an embodiment which transitions the SCVR between any of multiple modes which, for example, comprise a boost mode—e.g., in addition to a buck mode and/or a bypass mode. In various embodiments, system 200 provides functionality such as that of system 100, for example.

As shown in FIG. 2, system 200 comprises a SCVR 201 which includes a SC voltage converter, and a control signal generator 240 to variously operate multiple cores of the SC voltage converter. The multiple cores—e.g., including cores 205a, 205b, 205c—are coupled to multiple buses which, in this example, comprise a bus to receive an input voltage Vin, a bus to receive another input voltage Vss, a bus to provide an output voltage Vout (based on voltages Vin, Vout), M "top" charge redistribution buses (CRBs), and N "bottom" CRBs. In this particular context, "top" and "bottom" correspond (respectively) to a relatively high voltage Vin provided via a first switch network, and a relatively low voltage Vss provided via a first switch network. Moreover, M and N are integers which are each greater than one (1).

Each of cores 205a, 205b, 205c comprises a respective charge storage (e.g., including one or more capacitors) and a respective two switch networks. For example, core 205a comprises a charge storage 202, wherein terminals of charge storage 202 are coupled at respective nodes 204, 206. A first switch network of core 205a is coupled between a first terminal of charge storage 202 (at node 204) and first ones of the multiple buses. In the example embodiment shown, the first switch network comprises switch circuits STin, Stout which are coupled between node 204 and (respectively) the Vin bus and the Vout bus. The first switch network further comprises M switch circuits ST1, ..., STM which are coupled between node 204 and (respectively) the M top CRBs T1, ..., TM.

Furthermore, a second switch network of core 205a is coupled between a second terminal of charge storage 202 (at node 206) and second ones of the multiple buses. In the example embodiment shown, the second switch network comprises switch circuits SBss, SBout which are coupled between node 204 and (respectively) the Vss bus and the Vout bus. The second switch network further comprises N switch circuits SB1, ..., SBN which are coupled between node 206 and (respectively) the N bottom CRBs B1, ..., BN. Similar switch network topologies are also provided with cores 205b, 205c.

Control signal generator 240 provides functionality to generate control signals 242 to operate some or all of the multiple cores. Such operation is based on a current mode of control signal generator 240, wherein control signal generator 240 is (re)configurable to any of multiple modes which each correspond to a different respective switch state sequence.

For example, a first mode is to provide boost voltage regulation with SCVR 201, wherein the first mode corresponds to a first sequence of switch states of core 205a. In various embodiment, the first sequence comprises first successive switch states, wherein the Vout bus and the CRBs T1, ..., TM are variously coupled to the Vin bus—each during a different respective switch state of the first successive switch states—via each of the first switch network, the second switch network and the charge storage 202. In one such embodiment, the first sequence further comprises second successive switch states after the first successive switch states, wherein the Vss bus and the CRBs B1, ..., BN are variously coupled to the Vin bus—each during a different respective switch state of the second successive switch states—via each of the first switch network, the second switch network and the charge storage 202. In one such embodiment, the first sequence further comprises third successive switch states after the second successive switch states, wherein the CRBs T1, ..., TM are variously coupled to the Vss bus—each during a different respective switch state of the third successive switch states—via each of the first switch network, the second switch network and the charge storage 202. In one such embodiment, the first sequence further comprises fourth successive switch states after the third successive switch states, wherein the CRBs B1, ..., BN are variously coupled to the Vout bus—each during a different respective switch state of the fourth successive switch states—via each of the first switch network, the second switch network and the charge storage 202.

In the example embodiment shown, SCVR 201 is coupled to (or alternatively, includes) one or more sensor(s) 210 which are operable to sense one or more characteristics of a delivery of power with SCVR 201. By way of illustration and not limitation, the one or more characteristics comprise a level, rate of change, and/or other characteristic(s) of the output voltage Vout. Additionally or alternatively, the one or more characteristics comprises a level, rate of change, and/or other characteristic(s) of an output current with which SCVR 201 provides Vout. However, sensor(s) 210 sense any of various additional or alternative characteristics, in other embodiments.

Some or all of the one or more characteristics are indicated (e.g., via the illustrative signal 212 shown) to a monitor 220 of system 200. Monitor 220 monitors signal 212 to detect for a change (if any) to the one or more characteristics. In some embodiments, monitor 220 comprises circuitry and/or other suitable logic to determine which one of multiple criteria is currently satisfied by the one or more characteristics. In one such embodiment, the multiple criteria—e.g., each a criteria for providing a respective mode of control signal generator 240—each includes a respective range for each of the one or more characteristics. By way of illustration and not limitation, a given criteria comprises a range of values for the output voltage Vout, a range of values for an output current at the Vout bus, and/or the like. Based on a change to the one or more characteristics, monitor 220 sends to a mode selector 230 of system 200 a signal 222 which specifies or otherwise indicates a particular criteria as being currently satisfied.

Mode selector 230 includes, has access to, or otherwise operates based on reference information (not shown) which identifies the various criteria as corresponding each to a different respective mode of control signal generator 240. Based on the criteria indicated with signal 212, mode selector 230 accesses such reference information to identify a mode to be configured with control signal generator 240.

For example, mode selector 230 sends to control signal generator 240 a signal 232 which sets one or more values of configuration state information (CSI) 246. In an embodiment, control signal generator 240 generates control signals 242 based on configuration state information (CSI) 246 and mode logic 244 which specifies or otherwise indicates, for each of multiple modes, a respective switch state sequence to be provided with a given one of cores 205a, 205b, 205c.

By way of illustration and not limitation, mode logic 244 includes a table (or other suitable data structure) comprising entries which each correspond to a different respective configurable mode of control signal generator 240. Entries of the table each comprise a respective index to identify a corresponding mode, respective state sequence information for that corresponding mode, and respective mode transition information for that corresponding mode. In this context, "state sequence information" refers herein to information which specifies a switch state sequence—in this case, a sequence of switch states of core 205a—to be provided according to the corresponding mode of control signal generator 240. Furthermore, "mode transition information" refers herein to information which identifies at least one reference switch state of a corresponding switch state sequence.

In one example embodiment, index 243a is an identifier of some first mode, wherein state sequence information 245a specifies a first switch state sequence which is to be provided according to that first mode. Mode transition information 247a identifies at least some reference switch state of the first switch state sequence specified by state sequence information 245a. Similarly, index 243y is an identifier of some second mode, wherein state sequence information 245y specifies a second switch state sequence which is to be provided according to the second mode. Mode transition information 247y identifies at least some reference switch state of the second switch state sequence specified by state sequence information 245y. In one embodiment, control signal generator 240 provides functionality to seamlessly transition between the first mode and the second mode (for example) based on some or all of the reference switch states variously identified by state sequence information 245a and state sequence information 245y.

In various embodiments, sensor(s) 210, monitor 220, mode selector 230, and control signal generator 240 operate—while Vout is provided with system 200—to repeatedly update the mode(s) according to which cores 205a, 205b, 205c are operated with signals 242. Although SCVR 201 is shown as being coupled to, and distinct from, some other components of system 200, in various embodiments, some or all of sensor(s) 210, monitor 220, and mode selector 230 are incorporated in SCVR 201. In some embodiments, SCVR 201, cores 205a-c, control signal generator 240, mode logic 244, and CSI 246 correspond functionally to SCVR 110, cores 124a-x, control signal generator 140, mode logic 144, and CSI 146 (respectively).

Figure 3:
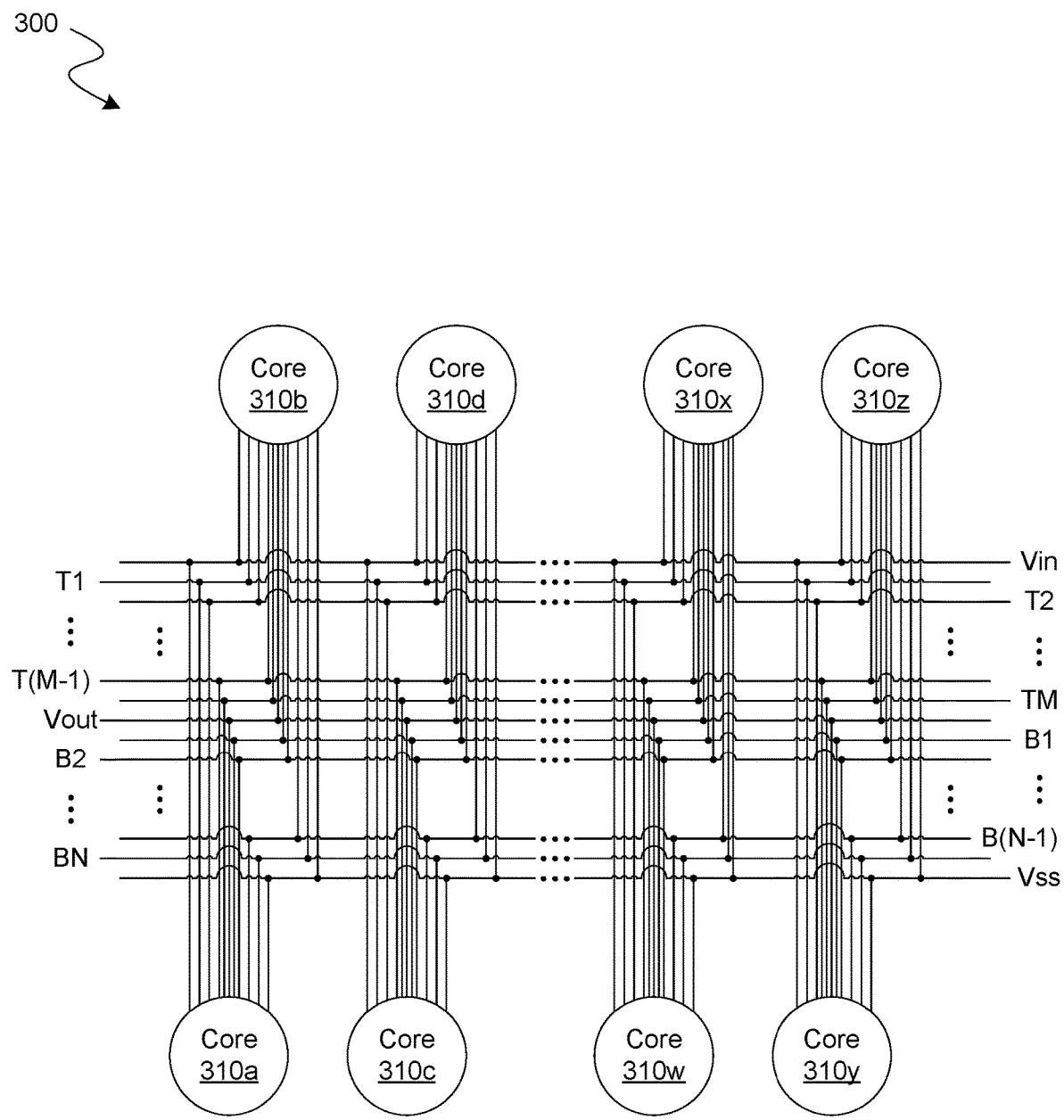
FIG. 3 shows a block diagram illustrating features of a switched capacitor voltage regulator to redistribute charge between various cores according to an embodiment.

FIG. 3 shows features of a SC voltage converter 300 to redistribute charge between various cores according to an embodiment. In various embodiments, SC voltage converter 300 provides functionality such as that of SCVR 110, or SCVR 201, for example.

As shown in FIG. 3, SC voltage converter 300 comprises converter cores 310a, . . . , 310z which are coupled to variously distribute charges with each other via multiple buses. In various embodiments, cores 310a, . . . , 310z each correspond functionally to a respective one of cores 124a, . . . , 124x—e.g., wherein some or all of cores 310a, . . . , 310z each have features of one of cores 205a-c, for example. In one such embodiment, cores 310a, . . . , 310z each comprise a respective capacitor, and respective switch networks each to selectively provide conductive paths, at different times, between that respective capacitor and various ones of the multiple buses.

For example, a given one of cores 310a, . . . , 310z, comprises two switch networks, one of which is coupled between the respective capacitor and a first plurality of buses, and the other of which is coupled between the respective capacitor and a second plurality of buses. In the example embodiment shown, the first plurality of buses comprises a first bus which receives a voltage Vin, a second bus to provide an output voltage Vout based on voltage Vin, and M charge redistribution buses T1, . . . , TM (where M is a positive integer). By contrast, the second plurality of buses comprises the second bus (which provides voltage Vout), a third bus which is to receive another input voltage Vss, and N other charge redistribution buses B1, . . . , BN (where N is a positive integer). In one such embodiment, a total number X of the cores 310a, . . . , 310z of SC voltage converter 300 is equal to the sum (1+2N+2M).

In various embodiments, SC voltage converter 300 further comprises, couples to, or otherwise accommodates operation with, control circuitry—such as that of control signal generator 140—which provides control signals (not shown) to operate the respective switch networks of cores 310a, . . . , 310z. For example, the control circuitry supports any of various modes which are each to provide a different respective sequence of switch states for some or all of cores 310a, . . . , 310z in a given cycle. In one such embodiment, the control signals comprise periodic signals (referred to herein as "non-overlapping clock signals") which have a same frequency, but non-overlapping phases.

Figure 4:
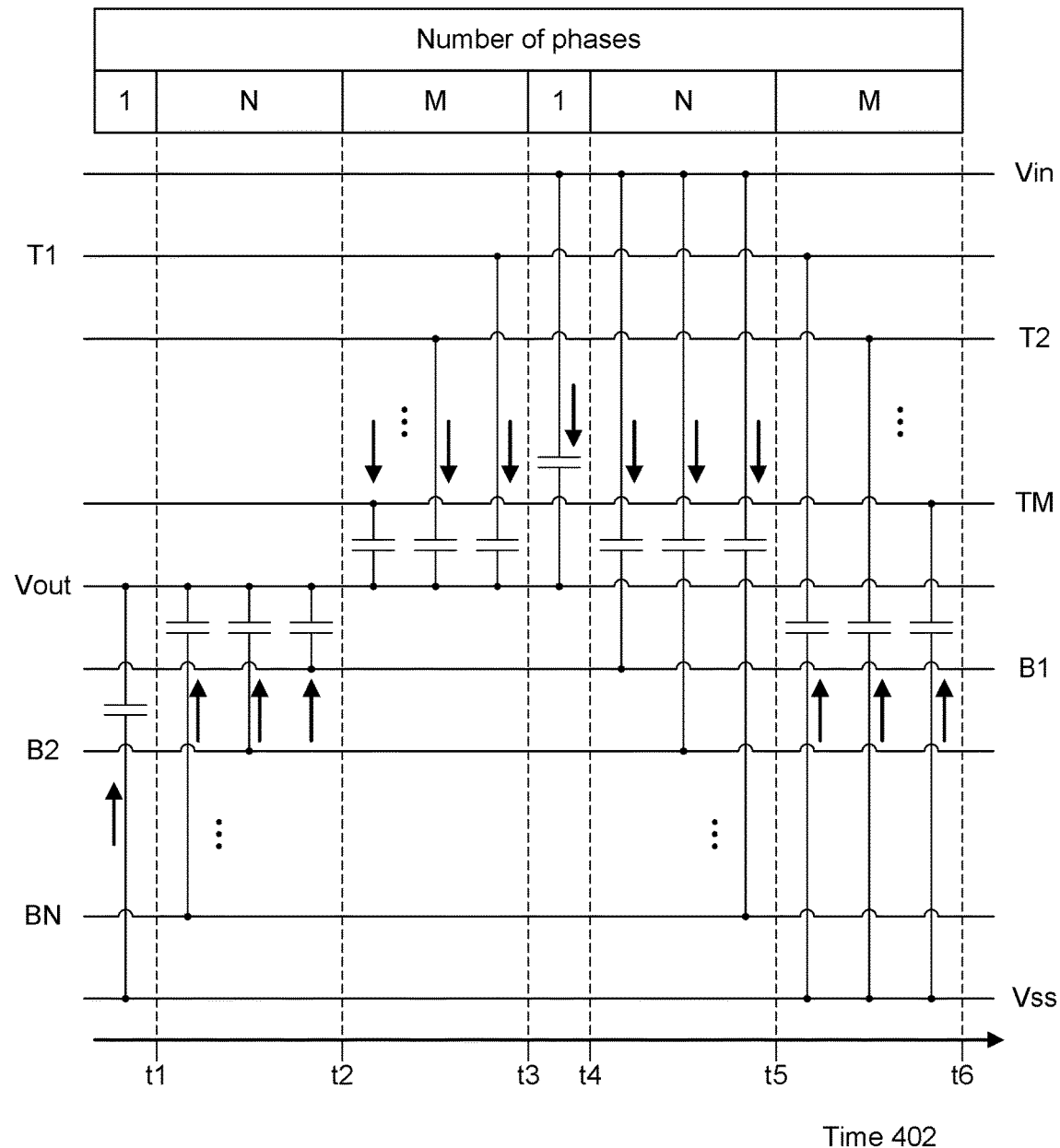
FIG. 4 shows a timing diagram illustrating features of buck mode operations by a switched capacitor voltage regulator according to an embodiment.

FIG. 4 shows features of a timing diagram 400 illustrating operations performed, with a switched-capacitor voltage regulator, during a buck mode of multiple configurable voltage regulation modes according to an embodiment. For example, operations such as those represented in timing diagram 400 are performed with one of cores 124a . . . 124x, one of cores 205a, 205b, 205c, or one of cores 310a, . . . , 310z.

As shown in FIG. 4, timing diagram 400 shows various conductive paths which are successively provided by a converter core over a period of time 402. The converter core comprises a first switch network, a second switch network, and a capacitor which is coupled between the first and second switch networks. For example, the capacitor, first switch network, and second switch network correspond functionally to charge storage 202, the switch network of core 205a which is coupled to charge storage 202 via node 204, and the other switch network of core 205a which is coupled to charge storage 202 via node 206. In one such embodiment, the first switch network is operated with first control signals which (for example) correspond functionally to switch control signals for operating switches SBss, SBout, and SB1 through SBN. By contrast, the second switch network is operated with second control signals which (for example) correspond functionally to switch control signals for operating switches STin, STout, and ST1 through STM.

In the example embodiment represented with timing diagram 400, the converter core is to be coupled to multiple buses comprising a first "Vin" bus which is to receive a first input voltage, a second "Vss" bus which is to receive a second input voltage, and a third "Vout" bus with which the voltage converter is to provide an output voltage based on the first and second input voltages. The multiple buses further comprise M charge redistribution buses T1, ..., TM, and N additional charge redistribution buses B1, ..., BN (where M and N are positive integers). In one such embodiment, a clock cycle—e.g., a single cycle of a reference clock signal—is divided into some number of phases to coordinate operation of the converter core with one or more other cores. For each such phase, a corresponding switch state of the converter core is to be configured to switchedly couple the capacitor to a respective two (or more) of the multiple buses. Such switch states are provided sequentially to facilitate a distribution of charges with the converter core and one or more other cores. In timing diagram 400, arrows represent various directions of charge distribution through the capacitor of the converter core.

In the example embodiment shown, the buck mode sequence in timing diagram 400 comprises a first plurality of successively configured switch states. The first plurality of switch states comprises a first switch state (during a phase ending at time t1) wherein the first switch network provides a conductive path, via the capacitor, between the Vss bus and the Vout bus. In an embodiment, the first plurality of switch states further comprises N switch states, each corresponding to a different respective bus of CRBs B1, ..., BN. For each of the N switch states (which are configured sequentially during the N phases between time t1 and time t2), the switch state provides a respective conductive path, via the capacitor, between the Vout bus and the corresponding one of CRBs B1, ..., BN.

In some embodiments, the buck mode sequence shown in timing diagram 400 further comprises a second plurality of switch states which are successively configured after the first plurality of successively configured switch states. For example, the second plurality of switch states comprises M switch states which each correspond to a different respective bus of CRBs T1, ..., TM. For each of the M switch states (which are configured sequentially during the M phases between time t2 and time t3), the switch state provides a respective conductive path, via the capacitor, between the Vout bus and the corresponding one of CRBs T1, ..., TM. In the embodiment shown, the second plurality of switch states further comprises another switch state (during a phase between times t3, t4) wherein the second switch network provides a conductive path, via the capacitor, between the Vout bus and the Vin bus In one such embodiment, the buck mode sequence shown in timing diagram 400 further comprises a third plurality of switch states which are successively configured after the second plurality of successively configured switch states. For example, the third plurality of switch states comprises another N switch states (e.g., configured sequentially during the N phases between time t4 and time t5) which each correspond to a different respective bus of CRBs B1, ..., BN. For each of the other N switch states, the switch state provides a respective conductive path, via the capacitor, between the Vin bus and the corresponding one of CRBs B1, ..., BN.

In one such embodiment, the buck mode sequence shown in timing diagram 400 further comprises a fourth plurality of switch states which are successively configured after the third plurality of successively configured switch states. In an embodiment, the fourth plurality of switch states comprises another M switch states which each correspond to a different respective bus of CRBs T1, ..., TM. For each of the fourth plurality of switch states, the switch state provides a respective conductive path, via the capacitor, between the Vss bus and the corresponding one of CRBs T1, ..., TM.

In some embodiments, the operations illustrated in timing diagram 400 are performed with circuitry which is configurable to any of multiple modes for controlling a SCVR, wherein the modes further comprise a boost mode. In one such embodiment, two or more of the modes each provide a different total number of switch states. For example, some or all such modes are each to provide a different respective total number of phases in a given cycle. In one such embodiment, the modes each provide a respective total number of phases which is less than or equal to (2N+2M+1).

Figure 5:
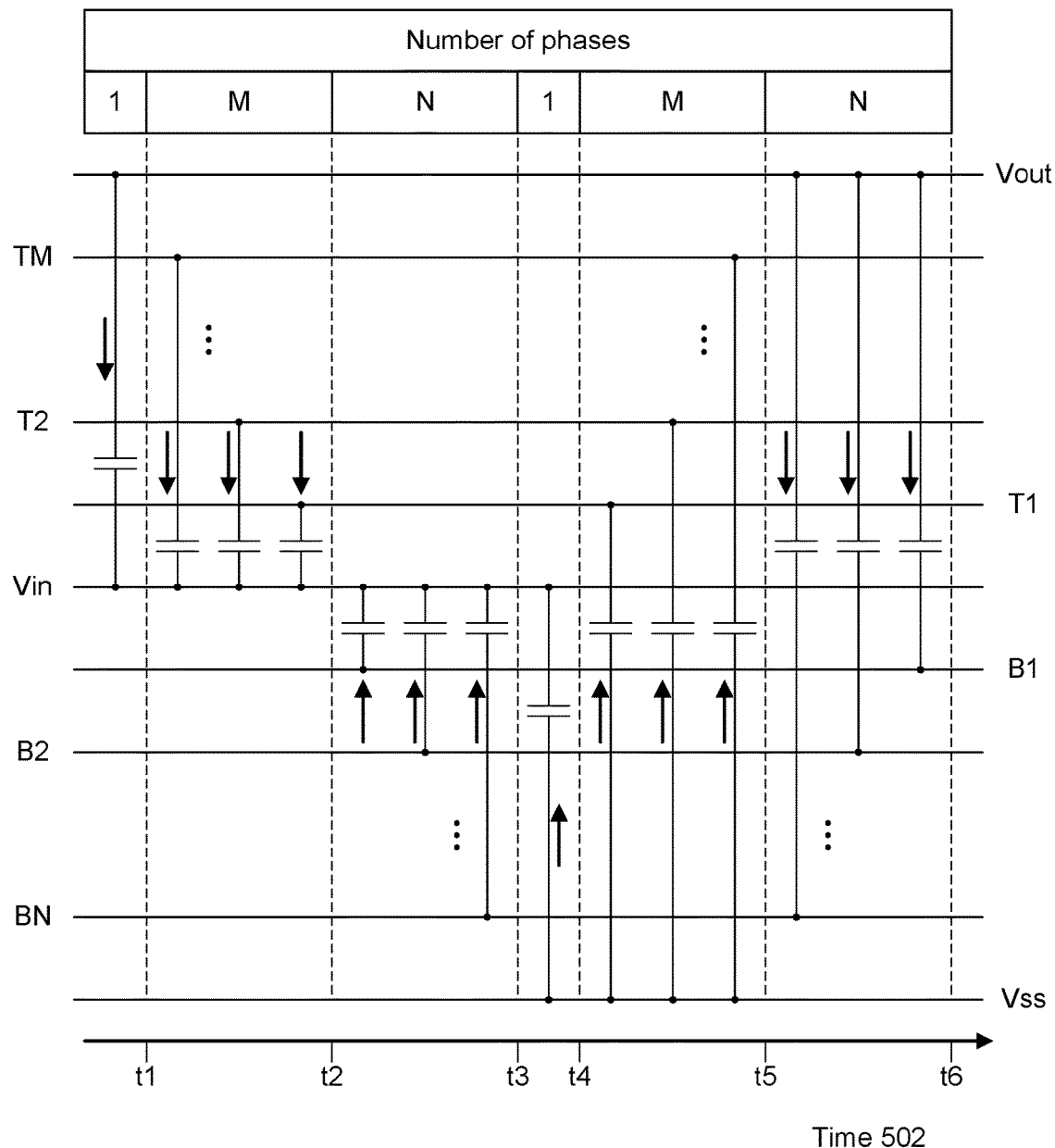
FIG. 5 shows a timing diagram illustrating features of boost mode operations by a switched capacitor voltage regulator according to an embodiment.

FIG. 5 shows features of a timing diagram 500 illustrating operations performed, with a switched-capacitor voltage regulator, during a boost mode of multiple configurable voltage regulation modes according to an embodiment. For example, operations such as those represented in timing diagram 500 are performed with one of cores 124a ... 124x, one of cores 205a, 205b, 205c, or one of cores 310a, ..., 310z.

As shown in FIG. 5, timing diagram 500 shows various conductive paths which are successively provided by a converter core over a period of time 502. To illustrate certain features of various embodiments, the operations represented in timing diagram 500 are described herein as being performed with the same SCVR as that used to perform the sequence represented in timing diagram 400. In the example embodiment shown, the boost mode sequence in timing diagram 500 comprises a first plurality of successively configured switch states. The first plurality of switch states comprises a first switch state (during a phase ending at time t1) wherein the first switch network provides a conductive path, via the capacitor, between the Vout bus and the Vin bus. In an embodiment, the first plurality of switch states further comprises M switch states, each corresponding to a different respective bus of CRBs T1, ..., TM. For each of the M switch states (which are configured sequentially during the M phases between time t1 and time t2), the switch state provides a respective conductive path, via the capacitor, between the Vin bus and the corresponding one of CRBs T1, ..., TM.

In some embodiments, the boost mode sequence shown in timing diagram 500 further comprises a second plurality of switch states which are successively configured after the first plurality of successively configured switch states. For example, the second plurality of switch states comprises N switch states which each correspond to a different respective bus of CRBs B1, ..., BN. For each of the N switch states (which are configured sequentially during the N phases between time t2 and time t3), the switch state provides a respective conductive path, via the capacitor, between the Vin bus and the corresponding one of CRBs B1, ..., BN. In the embodiment shown, the second plurality of switch states further comprises another switch state (during a phase between times t3, t4) wherein the second switch network provides a conductive path, via the capacitor, between the Vin bus and the Vss bus In one such embodiment, the boost mode sequence shown in timing diagram 500 further comprises a third plurality of switch states which are successively configured after the second plurality of successively configured switch states. For example, the third plurality of switch states comprises another M switch states (e.g., configured sequentially during the M phases between time t4 and time t5) which each correspond to a different respective bus of CRBs T1, ..., TM. For each of the other M switch states, the switch state provides a respective conductive path, via the capacitor, between the Vss bus and the corresponding one of CRBs T1, ..., TM.

In one such embodiment, the boost mode sequence shown in timing diagram 500 further comprises a fourth plurality of switch states which are successively configured after the third plurality of successively configured switch states. In an embodiment, the fourth plurality of switch states comprises another N switch states which each correspond to a different respective bus of CRBs B1, ..., BN. For each of the fourth plurality of switch states, the switch state provides a respective conductive path, via the capacitor, between the Vout bus and the corresponding one of CRBs B1, ..., BN.

Figure 6:
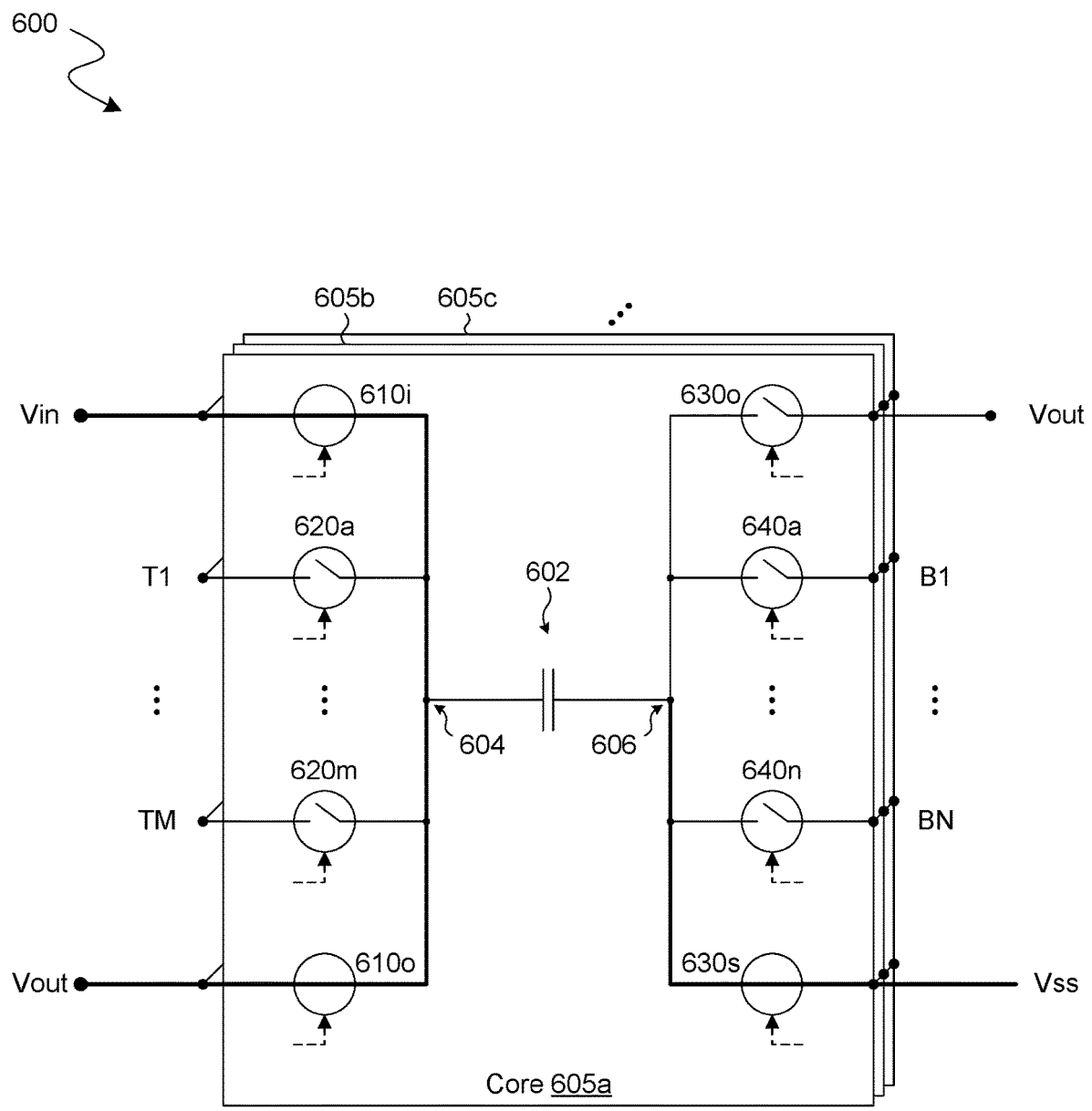
FIG. 6 shows a circuit diagram illustrating features of bypass mode of a switched capacitor voltage regulator according to an embodiment.

FIG. 6 shows features of a SCVR 600 which provides a bypass state according to an embodiment. In various embodiments, SCVR 600 provides functionality such as that of SCVR 110, SCVR 201 or SC voltage converter 300, for example.

As shown in FIG. 6, SCVR 600 comprises multiple converter cores—such as the illustrative cores 605a, 605b, 605c shown—which are coupled to each other in an in-parallel configuration via multiple buses. Each of cores 605a, 605b, 605c—corresponding functionally to cores 205a, 205b, 205c, for example—comprises a respective charge storage (e.g., including one or more capacitors) and a respective two switch networks. For example, core 605a comprises a charge storage 602, wherein terminals of charge storage 602 are coupled at respective nodes 604, 606. A first switch network of core 605a is coupled between a first terminal of charge storage 602 (at node 604) and first ones of the multiple buses.

In the example embodiment shown, the first switch network comprises switch circuits 610i, 610o which are coupled between node 604 and (respectively) the Vin bus and the Vout bus. The first switch network further comprises M switch circuits 620a, ..., 620m which are coupled between node 604 and (respectively) the M top CRBs T1, ..., TM. A second switch network of core 605a is coupled between a second terminal of charge storage 602 (at node 606) and second ones of the multiple buses. In the example embodiment shown, the second switch network comprises switch circuits 630o, 630s which are coupled between node 606 and (respectively) the Vout bus and the Vss bus. The second switch network further comprises N switch circuits 640a, ..., 640n which are coupled between node 606 and (respectively) the N bottom CRBs B1, ..., BN.

During a bypass state of SCVR 600, a first conductive path is provided with switch circuits 610i, 610o, wherein the first conductive path extends to each of the Vin bus, the Vout bus, and the terminal of charge storage 602 which is at node 604. Concurrently, a second conductive path, provided with switch circuit 630s, extends to each of the Vss bus, and the terminal of charge storage 602 which is at node 606. Furthermore, switch circuits 620a, ..., 620m, and switch circuits 640a, ..., 640n are variously deactivated to electrically decouple CRBs B1, ..., BN and CRBs T1, ..., TM from charge storage 602.

FIGS. 7A-7E show respective switch state sequences 700, 710, 720, 730, 740 each according to a respective mode each for controlling the same core of a given SC voltage converter. Switch operations such as those illustrated by sequences 700, 710, 720, 730, 740 are performed, for example, with circuitry of SCVR 110, system 200, SC voltage converter 300 and/or SCVR 600.

In an embodiment, the core comprises a capacitor, a first switch network coupled to a "top" terminal of the capacitor, and a second switch network which is coupled to a "bottom" terminal of the capacitor. The core (along with one or more other cores of the same SC voltage converter) is coupled to multiple buses—e.g., wherein the first switch network is to selectively provide one or more conductive paths between the top terminal and one or more of the multiple buses, and wherein the second switch network is to selectively provide one or more conductive paths between the bottom terminal and one or more other of the multiple buses.

For example, the multiple buses comprise a "Vin bus" which is to receive a first input voltage, a "Vss bus" which is to receive a second input voltage, and a "Vout bus" which is to provide an output voltage which is based on the first input voltage and the second input voltage. Furthermore, the multiple buses comprise three top CRBs T1, T2, and T3 which are to be switchedly coupled, via respective switch circuits of the first switch network, to the top terminal. Further still, the multiple buses comprise four bottom CRBs B1 through B4 which are to be switchedly coupled, via respective switch circuits of the second switch network, to the bottom terminal.

As shown in FIG. 7A, sequence 700—which is to provide "buck" voltage regulation—comprises sixteen switch states which each comprise a respective sub-state of the first switch network, and a respective sub-state the second switch network. The sixteen switch states are to be implemented in a relative order indicated by the numbers 0 through 15. For a given one of said switch states, an individual instance of the switch state being implemented is to have a duration of a respective one or more cycles of a clock (e.g., before the SCVR transitions to the next switch state of sequence 700).

In the example embodiment show, sequence 700 comprises a first switch state DSO wherein a conductive path is provided between the top terminal and the Vout bus, and wherein a conductive path is provided between the bottom terminal and the Vss bus. In a next switch state N4O of sequence 700 (successive to the first switch state DSO), a conductive path is provided between the top terminal and the Vout bus, wherein another conductive path is concurrently provided between the bottom terminal and CRB B4. In a third switch state N3O of sequence 700 (successive to switch state N4O), a conductive path is provided between the top terminal and the Vout bus, wherein another conductive path is concurrently provided between the bottom terminal and CRB B3. Various other switch states of sequence 700 are similarly shown in FIG. 7A.

As shown in FIG. 7B, sequence 710—which is to provide "boost" voltage regulation—comprises sixteen switch states which each comprise a respective sub-state of the first switch network, and a respective sub-state the second switch network. The sixteen switch states are to be implemented in a relative order indicated by the numbers 0 through 15. For a given one of said switch states, an individual instance of the switch state being implemented is to have a duration of a respective one or more cycles of a clock (e.g., before the SCVR transitions to the next switch state of sequence 710).

In the example embodiment show, sequence 710 comprises a first switch state DOI wherein a conductive path is provided between the top terminal and the Vout bus, and wherein a conductive path is provided between the bottom terminal and the Vin bus. In a next switch state M3I of sequence 710 (successive to the first switch state DOI), a conductive path is provided between the top terminal and the CRB T3, wherein another conductive path is concurrently provided between the bottom terminal and the Vin bus. In a third switch state M2I of sequence 710 (successive to switch state M3I), a conductive path is provided between the top terminal and the CRB T2, wherein another conductive path is concurrently provided between the bottom terminal and the Vin bus. Various other switch states of sequence 710 are similarly shown in FIG. 7B.

As shown in FIG. 7C, sequence 720—which is to provide "turbo buck" voltage regulation—comprises twelve switch states which each comprise a respective sub-state of the first switch network, and a respective sub-state the second switch network. The twelve switch states are to be implemented in a relative order indicated by the numbers 0 through 11. For a given one of said switch states, an individual instance of the switch state being implemented is to have a duration of a respective one or more cycles of a clock (e.g., before the SCVR transitions to the next switch state of sequence 720).

In the example embodiment show, sequence 720 comprises a first switch state DSO wherein a conductive path is provided between the top terminal and the Vout bus, and wherein a conductive path is provided between the bottom terminal and the Vss bus. In a next switch state N34O of sequence 720 (successive to the first switch state DSO), a conductive path is provided between the top terminal and the Vout bus, wherein other conductive paths are concurrently provided each between the bottom terminal and a respective one of the CRBs B3, B4. In a third switch state N12O of sequence 720 (successive to switch state N34O), a conductive path is provided between the top terminal and the Vout bus, wherein other conductive paths are concurrently provided each between the bottom terminal and a respective one of the CRBs B1, B2. Various other switch states of sequence 720 are similarly shown in FIG. 7C.

Switch state N34O of sequence 720 effectively merges active switch states such as those of states N3O, N4O of sequence 700. Similarly, switch state N12O of sequence 720 effectively merges of active switch states such as those of states N1O, N2O of sequence 700. In this particular context, such "merging" effectively shorts two or more buses to each other, and to a terminal of a capacitor, via switch circuits which are active during a given switch mode. Accordingly, in some embodiments, two switch circuits—coupled in parallel with each other to the same capacitor terminal—are both active during a switch state of one switch state sequence. However, during a switch state of another such switch state sequence, only one of the two switch circuits is active.

As shown in FIG. 7D, sequence 730—which is to provide "turbo boost" voltage regulation—comprises twelve switch states which each comprise a respective sub-state of the first switch network, and a respective sub-state the second switch network. The twelve switch states are to be implemented in a relative order indicated by the numbers 0 through 11. For a given one of said switch states, an individual instance of the switch state being implemented is to have a duration of a respective one or more cycles of a clock (e.g., before the SCVR transitions to the next switch state of sequence 730).

In the example embodiment show, sequence 730 comprises a first switch state DIS wherein a conductive path is provided between the top terminal and the Vis bus, and wherein a conductive path is provided between the bottom terminal and the Vss bus. In a next switch state M123S of sequence 730 (successive to the first switch state DIS), conductive paths are provided each between the top terminal and a different respective one of CRBs T1 through T3, wherein another conductive path is concurrently provided between the bottom terminal and the Vss bus. In a third switch state N4O of sequence 730 (successive to switch state M123S), a conductive path is provided between the top terminal and the Vou bus, wherein another conductive path is concurrently provided between the bottom terminal and the CRB B4. Various other switch states of sequence 730 are similarly shown in FIG. 7D.

As shown in FIG. 7E, sequence 740—which is to provide another type of turbo buck voltage regulation—comprises eight switch states which each comprise a respective sub-state of the first switch network, and a respective sub-state the second switch network. The eight switch states are to be implemented in a relative order indicated by the numbers 0 through 7. For a given switch state, an individual instance of the being implemented is to have a duration of a respective one or more cycles of a clock (e.g., before the SCVR transitions to the next switch state of sequence 740).

In the example embodiment show, sequence 740 comprises a first switch state DSO wherein a conductive path is provided between the top terminal and the Vout bus, and wherein a conductive path is provided between the bottom terminal and the Vss bus. In a next switch state N34O of sequence 740 (successive to the first switch state DSO), a conductive path is provided between the top terminal and the Vout bus, wherein other conductive paths are concurrently provided each between the bottom terminal and a different respective one of CRBs B3, B4. In a third switch state N12O of sequence 740 (successive to switch state N34O), a conductive path is provided between the top terminal and the Vout bus, wherein other conductive paths are concurrently provided each between the bottom terminal and a different respective one of CRBs B3, B4. Various other switch states of sequence 740 are similarly shown in FIG. 7E.

To facilitate seamless transition between voltage regulation modes, some embodiments variously designate a particular switch state of a given switch state sequence as being a reference switch state, at least with respect to a transition between that switch state sequence and some other switch state sequence. Some embodiments designate a first reference switch state of a first sequence of switch states which are to be provided according to a first mode, and—for example—further designate a second reference switch state of a second sequence of switch states which are to be provided according to a second mode.

In one such embodiment, the first reference switch state is to be a last switch state to be provided according to the first mode (e.g., before a transition from the first mode to the second mode). Furthermore, the second reference switch state—or, for example, a next switch state after the second reference switch state in the second sequence—is to be a first switch state which is provided, according to the second mode, after the transition from the first mode.

In some embodiments, the first reference switch state and the second reference switch state are the same—e.g., wherein a transition from the first mode to the second mode is to comprise providing the first reference switch state as a last switch state according to the first mode, and wherein a next switch state to be provided after the first reference switch state is the second reference switch state (or a next switch state of the second sequence after the second reference switch state). Alternatively or in addition, the first reference switch state is one of a first sub-sequence of the first sequence—e.g., the first sub-sequence comprising two or more (and, in some embodiments, three or more) successive switch states—wherein the second sequence also comprises the first sub-sequence.

Alternatively or in addition, one of the first mode or the second mode is a boost mode (or, alternatively, a buck mode), wherein the other of the first mode or the second mode is a turbo version of that boost (or buck) mode. In some embodiments, for each of one or more switch states of such a turbo mode, the switch state corresponds to a merging of a respective two or more switch states of the boost (or buck) mode. In one such embodiment, a reference switch state of the turbo mode is a switch state other than any which corresponds to a merging of switch states of the boost (or buck) mode—e.g., wherein the reference switch state of the turbo mode is identical to a switch state of the boost (or buck) mode.

By way of illustration and not limitation, in an illustrative scenario according to one embodiment, with respect to a transition between one of sequences 700, 710 and the other of sequences 700, 710, one switch state in the sub-sequence N4O, N3O, N2O, N1O—which is common to sequences 700, 710—is a first reference switch state. Furthermore, that same one switch state (or alternatively, a next switch state in the sub-sequence N4O, N3O, N2O, N1O) is a second reference switch state. Alternatively, one switch state in the sub-sequence M1S, M2S, M3S—which is also common to sequences 700, 710—is the first reference switch state, wherein that same one switch state (or alternatively, a next switch state in the sub-sequence M1S, M2S, M3S) is the second reference switch state. Alternatively, one switch state in the sub-sequence N1I, N2I, N3I, N4I—which is also common to sequences 700, 710—is the first reference switch state, wherein that same one switch state (or alternatively, a next switch state in the sub-sequence N1I, N2I, N3I, N4I) is the second reference switch state In an illustrative scenario according to another embodiment, with respect to a transition between one of sequences 700, 720 and the other of sequences 700, 720, one switch state in the sub-sequence M3O, M2O, M1O—which is common to sequences 700, 720—is a first reference switch state. Furthermore, that same one switch state (or alternatively, a next switch state in the sub-sequence M3O, M2O, M1O) is a second reference switch state. Alternatively, one switch state in the sub-sequence M1S, M2S, M3S—which also is common to sequences 700, 720—is the first reference switch state, wherein that same one switch state (or alternatively, a next switch state in the sub-sequence M1S, M2S, M3S) is the second reference switch state. Alternatively, the switch state DSO is a first reference switch state, wherein a next switch state after switch state DSO is the second reference switch state. Alternatively, the switch state DSO is a first reference switch state, wherein a next switch state after switch state DIG is the second reference switch state In an illustrative scenario according to still another embodiment, with respect to a transition between one of sequences 710, 730 and the other of sequences 710, 730, one switch state in the sub-sequence N4O, N3O, N2O, N1O—which is common to sequences 710, 730—is a first reference switch state. Furthermore, that same one switch state (or alternatively, a next switch state in the sub-sequence N4O, N3O, N2O, N1O) is a second reference switch state. Alternatively, one switch state in the sub-sequence N1I, N2I, N3I, N4I—which is also common to sequences 710, 730—is the first reference switch state, wherein that same one switch state (or alternatively, a next switch state in the sub-sequence N1I, N2I, N3I, N4I) is the second reference switch state. Alternatively, the switch state DIS is the first reference switch state, wherein a next switch state after switch state DIS is the second reference switch state. Alternatively, the switch state DOI is the first reference switch state, wherein a next switch state after switch state DOI is the second reference switch state.

Some embodiments select a particular one of multiple modes (e.g., including selecting from among modes which each correspond to a respective one of sequences 700, 710, 720, 730, 740) based on one or more characteristics of power delivery with a SC voltage converter. For example, the one or more characteristics include (or are otherwise indicative of) an output voltage, an output current, an input voltage, an input current, and/or the like.

In an illustrative scenario for one embodiment, a sensing of such one or more characteristics includes or otherwise results in the detection of an increase of an output voltage which is provided with the SC voltage converter. Based on said increase, one such embodiment transitions controller circuitry, such as that of control signal generator 140, from a mode which provides buck voltage regulation, to another mode which provides boost voltage regulation. Conversely, a decreased output voltage results in a transition from a mode which provides boost voltage regulation, to another mode which provides buck voltage regulation Additionally or alternatively, some embodiments—based on such an increase to the output voltage—transition the controller circuitry from a mode which provides a switch state sequence having relatively more phases (and/or more switch states), to another mode which provides a switch state sequence having relatively fewer phases (and/or fewer switch states). Conversely, a decreased output voltage—in some embodiments—results in a transition from a mode which provides a switch state sequence having relatively fewer phases (and/or fewer switch states), to another mode which provides a switch state sequence having relatively more phases (and/or more switch states). In one such embodiment, a range of output voltage levels corresponds to a relatively high number of phases (and/or switch states) to be provided with the SC voltage converter—e.g., wherein the number of phases and/or switch states to be provided is lower if the output voltage is above said range.

Additionally or alternatively, sensing one or more characteristics includes or otherwise results in the detection of an increase of an output current. Based on said increased current, one embodiment transitions the controller circuitry from a mode which provides a switch state sequence having relatively more phases (and/or more switch states), to another mode which provides a switch state sequence having relatively fewer phases (and/or fewer switch states). Conversely, a decreased output current—in some embodiments—results in a transition from a mode which provides a switch state sequence having relatively fewer phases (and/or fewer switch states), to another mode which provides a switch state sequence having relatively more phases (and/or more switch states).

Figure 8:
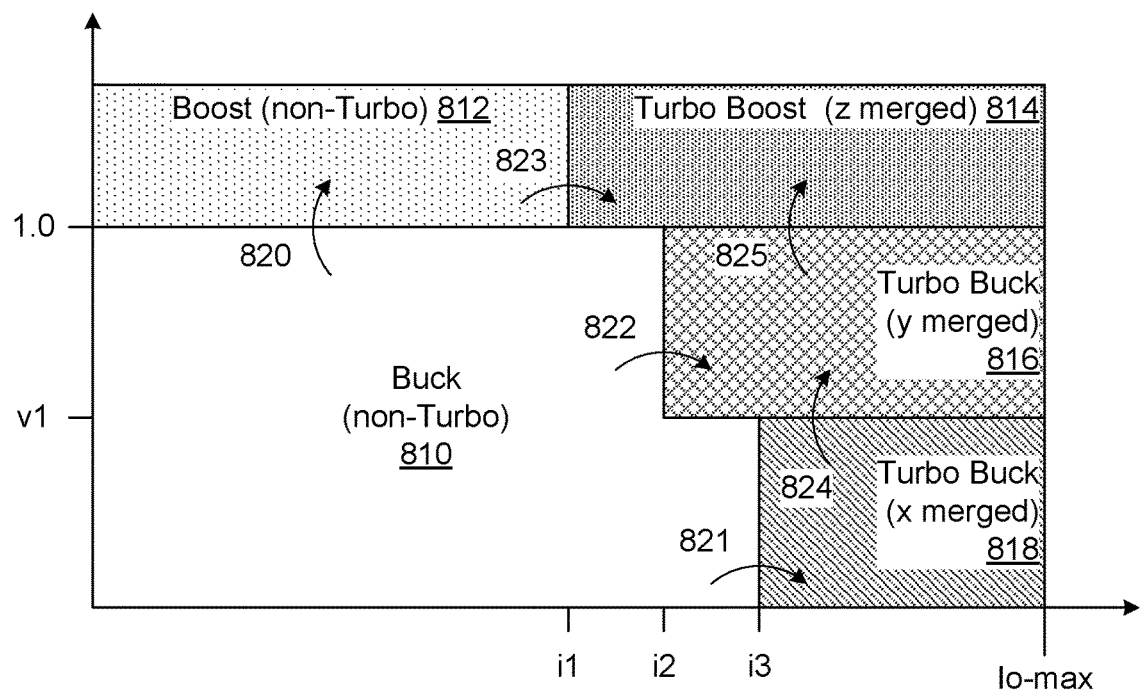
FIG. 8 shows a chart illustrating operational domains each corresponding to a respective mode of a switched capacitor voltage regulator according to an embodiment.

By way of illustration and not limitation, FIG. 8 shows a graph 800 illustrating a relationship of different voltage regulation control modes with respect to a range 802 of values of an output current Io, and a range 804 of values of a voltage conversion ratio (VCR). As used herein, "VCR" refers to a ratio of an output voltage Vout to an input voltage Vin with which a SCVR generates the voltage Vout.

In the example embodiment shown, a controller is subject to a transition 820—from a buck mode 810 to a boost mode 812—based on an increase in the VCR while the output current Io is in a first range (e.g., lower than the current level i1). In one such embodiment, the controller is additionally or alternatively subject to a transition 821—from the buck mode 810 to a first turbo buck mode 818—based on an increase in the output current Io, above a threshold level i3, while the VCR is in a second range (e.g., less than the illustrative threshold level v1 shown). Furthermore, the controller is additionally or alternatively subject to a transition 822—from the buck mode 810 to a second turbo buck mode 816—based on an increase in the output current Io, above a lower threshold level i2, while the VCR is in a third range (e.g., between the threshold level v1 and 1). Further still, the controller is additionally or alternatively subject to a transition 823—from the boost mode 812 to a turbo boost mode 814—based on an increase in the output current Io, above a threshold level i1, while the VCR is greater than one (1).

In various embodiments, the controller is additionally or alternatively subject to a transition 824—from the first turbo buck mode 818 to the second turbo buck mode 816—based on an increase in the VCR, above the threshold level v1, while the output current Io is in a fourth range (e.g., above the threshold level i3). In one such embodiment, the controller is additionally or alternatively subject to a transition 825—from the second turbo buck mode 816 to the turbo boost mode 814—based on an increase in the VCR, above one (1), while the output current Io is in a fifth range (e.g., above the threshold level i2).

In the example embodiment shown, turbo buck mode 818 merges some x switch states (where x is an integer greater than one) of buck mode 810. Furthermore, turbo buck mode 816 merges some y switch states of buck mode 810—e.g., wherein y is an integer greater than x. Further still, turbo boost mode 814 merges some z switch states of boost mode 812—e.g., wherein z is an integer greater than or equal to y.

Frequently, the determining of a mode of control for a SCVR (or any of various other voltage regulators) depends on information from a current sensor (CS) that—for example—measures an input current to, or an output current from, said voltage regulator. Conventionally, current measurement typically relies on measuring a voltage across a shunt-resistor with a known resistance. However, adding a shunt resistance—especially one with a sufficiently large voltage drop to measure current accurately—to an output (or input) of a voltage regulator tends to significantly increase conduction loss in the current path.

Some embodiments variously avoid or otherwise mitigate such conduction losses by providing a current sensor which—instead of measuring an analog voltage across a shunt-resistor—operates digitally based on some reference information which specifies or otherwise indicates one or more parameters of a previously determined function according to which the current varies.

Figure 9:
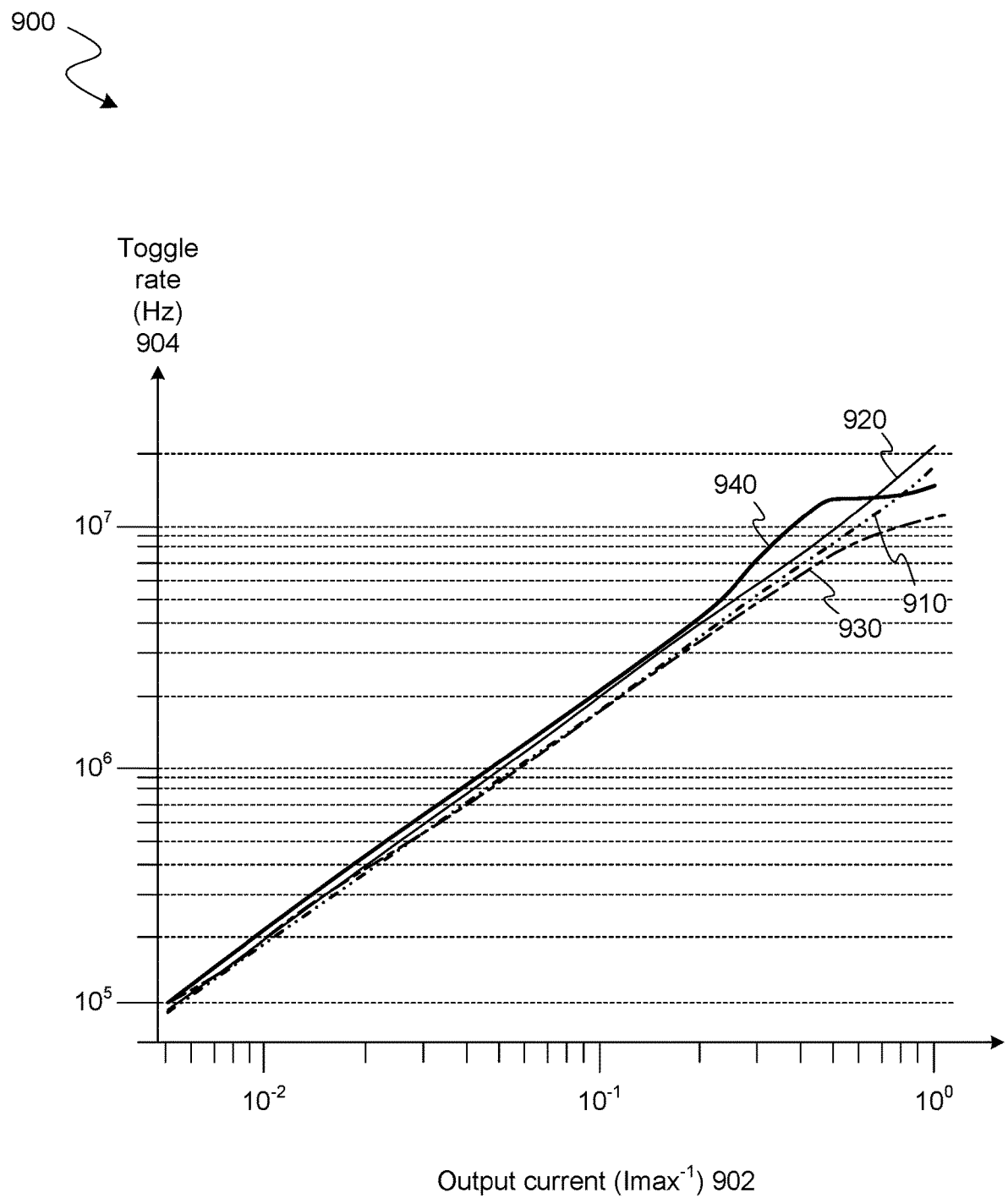
FIG. 9 shows a graph illustrating output current characteristics of a switched capacitor voltage regulator according to an embodiment.

By way of illustration and not limitation, FIG. 9 shows a graph 900 illustrating various relationship each of a respective toggle rate 904 of the SCVR, to an output current 902 which is provided by the SCVR. In this particular context, "toggle rate" refers to a rate of switch events which variously transition the SCVR each between a respective two switch states. In graph 900, the plots correspond to different respective levels of the input voltage Vin provided to a SCVR—e.g., wherein plots 910, 920, 930, 940 correspond (respectively) to 0.7 V, 0.9 V, 1.0 V, and 1.1 V. As shown in graph 900, plots 910, 920, 930, 940 have different respective slopes and/or tend to variously diverge from one another with increasing levels of output current 902.

Figure 10:
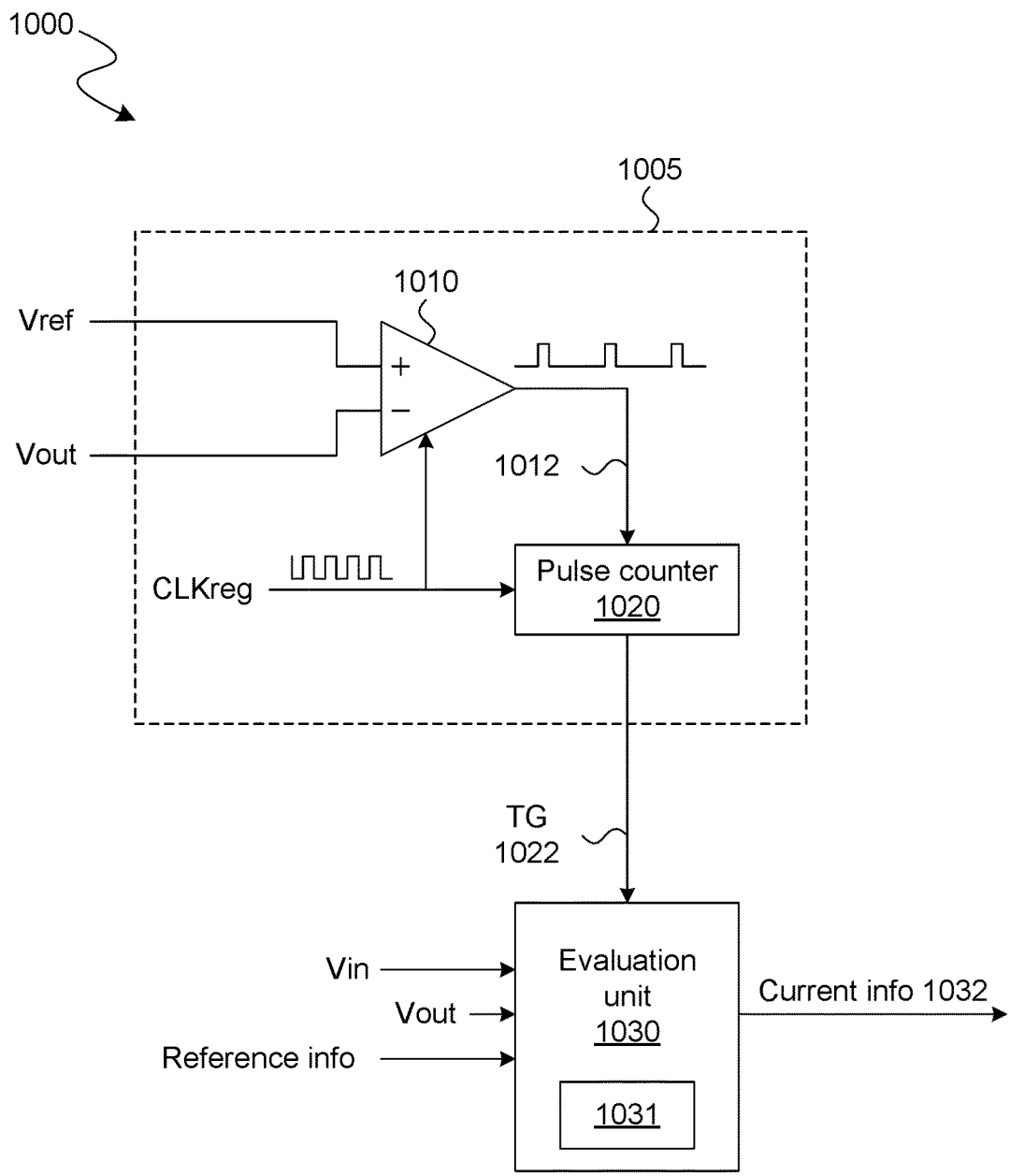
FIG. 10 shows a circuit diagram illustrating features of a sensor to detect a current conducted with a switched capacitor voltage regulator according to an embodiment.

FIG. 10 shows a current sensor 1000 to provide an output indicating a level of a current which is conducted by a SCVR (or other voltage regulator) according to an embodiment. Current sensor 1000 illustrates one example of an embodiment comprising a detector unit and an evaluation unit, wherein the detector unit detects generates a first signal—e.g., based on an output voltage from a voltage regulator—which identifies a rate of switch events by the voltage regulator. The evaluation unit receives the first signal, and generates an output signal based on both the rate of switch events, and reference information which was previously provided to the evaluation unit 1030. The reference information specifies or otherwise indicates a function according to which a current, conducted by the voltage regulator, varies based on one or more operational characteristics of the voltage regulator. The output signal identifies an indicated amount of that current. In one illustrative embodiment, the one or more sensor(s) 210 include current sensor 1000, for example.

In the illustrative embodiment shown, current sensor 1000 comprises a detector unit 1005 and an evaluation unit 1030 coupled thereto wherein (for example, detector unit 1005 includes a comparator 1010 and a pulse counter 1020. Comparator 1010 accommodates coupling to receive or otherwise detect an output voltage Vout from the SCVR. The comparator 1010 generates a signal 1012 which indicates (for example) when a sampled instance of voltage Vout is less than a reference voltage level Vref. The sampling by comparator 1010 is regulated, for example, by the illustrative periodic signal CLKreg shown.

In various embodiments, current sensor 1000 further comprises a pulse counter which receives both the signal 1012 and the signal CLKreg. Based on signal 1012 and signal CLKreg, pulse counter generates a signal TG 1022 which identifies a toggle rate of the SCVR. For example, the toggle rate (TG) is equal to or otherwise based on a product of a switching frequency of the SCVR, and value which represents a ratio of a number of pulses by signal 1012 to a concurrent number of pulses by signal CLKreg.

In one such embodiment, an evaluation unit 1030 of current sensor 1000 is coupled to receive signal TG 1022 from pulse counter—e.g., wherein evaluation unit 1030 is further coupled to receive additional information for use in determining, based on signal TG 1022, a level of a current which is conducted by the SCVR. By way of illustration and not limitation, evaluation unit 1030 is coupled to receive or otherwise detect the output voltage Vout, an input voltage Vin with which the SCVR generates the output voltage Vout. Additionally or alternatively, evaluation unit 1030 is coupled to receive reference information (which is then stored in a repository 1031 such as a table or other suitable resource) which specifies or otherwise indicates a function which describes how the current varies with one or more operational characteristics of the SCVR. In an example embodiment, evaluation unit 1030 is preprogrammed or otherwise preconfigured with such reference information—e.g., based on a previous evaluation of a performance profile of some or all circuitry of the SCVR. For example, such an evaluation takes place after one or more of a semiconductor fabrication process, a packaging process, a board assembly process, or the like. For example, the reference information represents performance profile characteristics such as those shown in graph 900.

In one such embodiment, a memory, programmable gate array, application-specific integrated circuit, or other suitable resource of evaluation unit 1030 is accessed, programmed or otherwise configured based on the above-described reference information. By way of illustration and not limitation, repository 1031 stores one or more coefficients and/or other parameters of a function for calculating a current level based on one or more operational characteristics of current sensor 1000. Additionally or alternatively, repository 1031 provides one or more lookup tables to store various predetermined values for one of one or more equations representing the current as a function of the one or more operational characteristics.

In various embodiments, evaluation unit 1030 generates an output signal 1032 based on the reference information and the signal TG 1022, wherein output signal 1032 identifies an amount of a current that is conducted with the voltage regulator. Output signal 1032 is provided, for example, as a feedback to change an operation of the voltage regulator. Additionally or alternatively, output signal 1032 is provided as telemetry information to one or more analytic (e.g., power management) resources.

Signal 1032 identifies a detected amount of a current such as (for example) an input current which is received by the voltage regulator, and an output current which is provided by the voltage regulator. In an embodiment, the current is determined as a function of a rate of switch events (indicated by signal TG 1022), an input voltage provided to the voltage regulator, an output voltage generated by the voltage regulator, and/or other operational characteristics. By way of illustration and not limitation, the function comprises a product of each of the rate of switch events, a capacitance of the voltage regulator, the input voltage, and the output voltage.

In an illustrative scenario according to one embodiment, evaluation unit 1030 performs a calculation, lookup or other operation to determine an output current Iout from the SCVR, wherein such determining is based on the reference information indicating the following equation:

$$Iout = (Ctotal)\{[(sl_{iovi})(Vin)] - [(sl_{iovo})(Vout)]\}(TG) + (i_{offo}) \quad (1)$$

In the above equation (1), Ctotal is a total amount of a capacitance of the SCVR, wherein $sl_{iovi}$ is a coefficient based on a rate of change of the output current with the input voltage (Vin), wherein $sl_{iovo}$ is a coefficient based on a rate of change of the output current with the output voltage (Vout), wherein TG is the toggle rate identified by signal 1022, and wherein $i_{offo}$ is an offset current to be applied.

Additionally or alternatively, evaluation unit 1030 performs another calculation, lookup or other operation to determine an input current Iin provided to the SCVR, wherein such determining is based on the reference information indicating the following equation:

$$Iin = (Ctotal)\{[(sl_{iivi})(Vin)] - [(sl_{iivo})(Vout)]\}(TG) + (i_{offi}) \quad (2)$$

In the above equation (1), $sl_{iivi}$ is a coefficient based on a rate of change of the input current Iout with the input voltage Vin, wherein $sl_{iivo}$ a coefficient based on a rate of change of the input current Iin with the output voltage Vout, and wherein $i_{offi}$ is another offset current to be applied.

Figure 11:
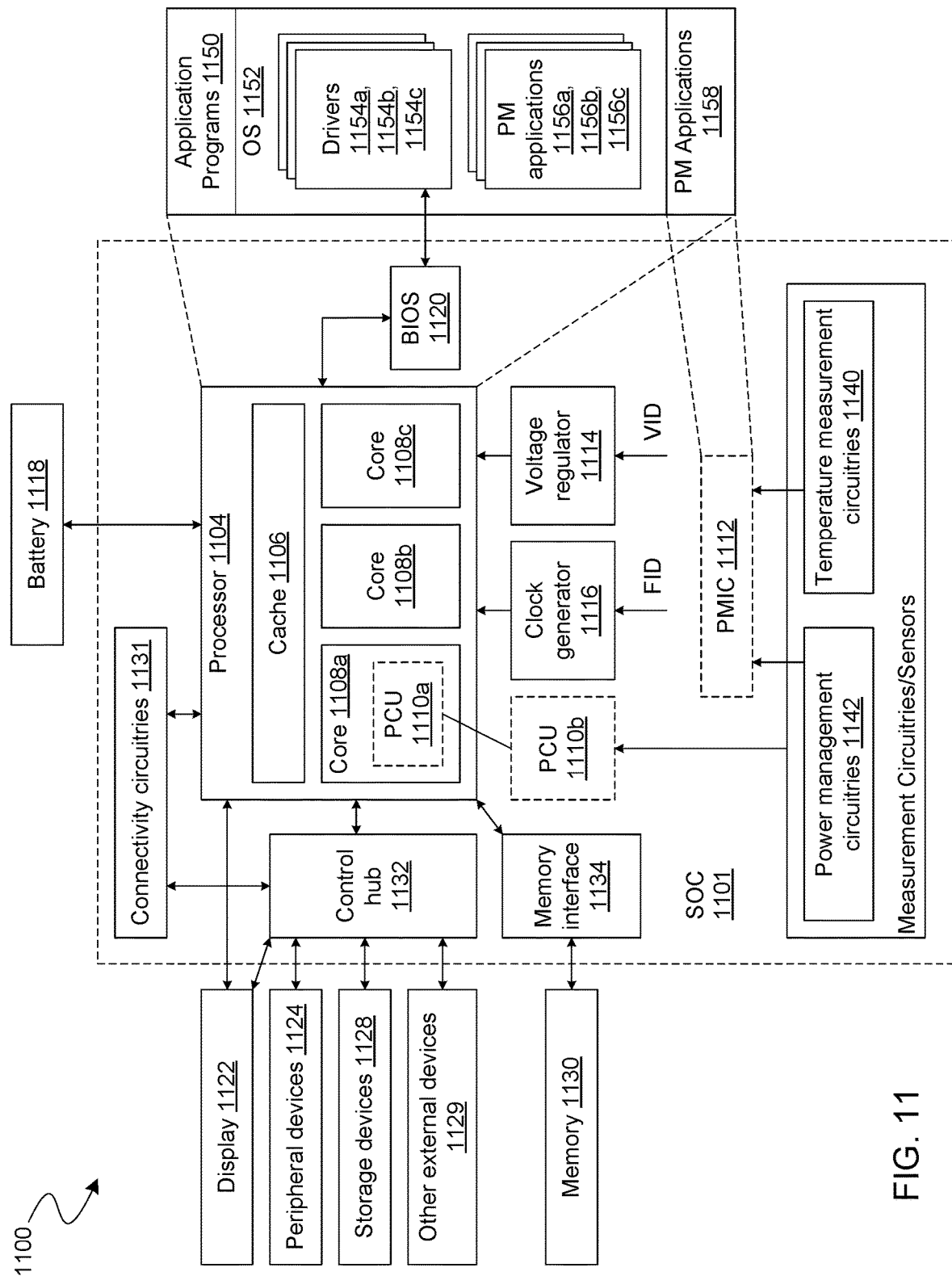
FIG. 11 shows a circuit block diagram illustrating features of a computer device to determine a mode of voltage regulation according to an embodiment.

FIG. 11 illustrates a computer system or computing device 1100 (also referred to as device 1100), where a mode of voltage regulation is determined, in accordance with some embodiments. It is pointed out that those elements of FIG. 11 having the same reference numbers (or names) as the elements of any other figure can operate or function in any manner similar to that described, but are not limited to such.

In some embodiments, device 1100 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 1100.

In an example, the device 1100 comprises a SoC (System-on-Chip) 1101. An example boundary of the SOC 1101 is illustrated using dotted lines in FIG. 11, with some example components being illustrated to be included within SOC 1101—however, SOC 1101 may include any appropriate components of device 1100.

In some embodiments, device 1100 includes processor 1104. Processor 1104 can include one or more physical devices, such as microprocessors, application processors, microcontrollers, programmable logic devices, processing cores, or other processing means. The processing operations performed by processor 1104 include the execution of an operating platform or operating system on which applications and/or device functions are executed. The processing operations include operations related to I/O (input/output) with a human user or with other devices, operations related to power management, operations related to connecting computing device 1100 to another device, and/or the like. The processing operations may also include operations related to audio I/O and/or display I/O.

In some embodiments, processor 1104 includes multiple processing cores (also referred to as cores) 1108a, 1108b, 1108c. Although merely three cores 1108a, 1108b, 1108c are illustrated in FIG. 11, the processor 1104 may include any other appropriate number of processing cores, e.g., tens, or even hundreds of processing cores. Processor cores 1108a, 1108b, 1108c may be implemented on a single integrated circuit (IC) chip. Moreover, the chip may include one or more shared and/or private caches, buses or interconnections, graphics and/or memory controllers, or other components.

In some embodiments, processor 1104 includes cache 1106. In an example, sections of cache 1106 may be dedicated to individual cores 1108 (e.g., a first section of cache 1106 dedicated to core 1108a, a second section of cache 1106 dedicated to core 1108b, and so on). In an example, one or more sections of cache 1106 may be shared among two or more of cores 1108. Cache 1106 may be split in different levels, e.g., level 1 (L1) cache, level 2 (L2) cache, level 3 (L3) cache, etc.

In some embodiments, a given processor core (e.g., core 1108a) may include a fetch unit to fetch instructions (including instructions with conditional branches) for execution by the core 1108a. The instructions may be fetched from any storage devices such as the memory 1130. Processor core 1108a may also include a decode unit to decode the fetched instruction. For example, the decode unit may decode the fetched instruction into a plurality of micro-operations.

Processor core 1108*a* may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 1108*a* (for example) may be an out-of-order processor core in one embodiment. Processor core 1108*a* may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 1108*a* may also include a bus unit to enable communication between components of the processor core 1108*a* and other components via one or more buses. Processor core 1108*a* may also include one or more registers to store data accessed by various components of the core 1108*a* (such as values related to assigned app priorities and/or sub-system states (modes) association.

In some embodiments, device 1100 comprises connectivity circuitries 1131. For example, connectivity circuitries 1131 includes hardware devices (e.g., wireless and/or wired connectors and communication hardware) and/or software components (e.g., drivers, protocol stacks), e.g., to enable device 1100 to communicate with external devices. Device 1100 may be separate from the external devices, such as other computing devices, wireless access points or base stations, etc.

In an example, connectivity circuitries 1131 may include multiple different types of connectivity. To generalize, the connectivity circuitries 1131 may include cellular connectivity circuitries, wireless connectivity circuitries, etc. Cellular connectivity circuitries of connectivity circuitries 1131 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 1131 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 1131 may include a network interface, such as a wired or wireless interface, e.g., so that a system embodiment may be incorporated into a wireless device, for example, cell phone or personal digital assistant.

In some embodiments, device 1100 comprises control hub 1132, which represents hardware devices and/or software components related to interaction with one or more I/O devices. For example, processor 1104 may communicate with one or more of display 1122, one or more peripheral devices 1124, storage devices 1128, one or more other external devices 1129, etc., via control hub 1132. Control hub 1132 may be a chipset, a Platform Control Hub (PCH), and/or the like.

For example, control hub 1132 illustrates one or more connection points for additional devices that connect to device 1100, e.g., through which a user might interact with the system. For example, devices (e.g., devices 1129) that can be attached to device 1100 include microphone devices, speaker or stereo systems, audio devices, video systems or other display devices, keyboard or keypad devices, or other I/O devices for use with specific applications such as card readers or other devices.

As mentioned above, control hub 1132 can interact with audio devices, display 1122, etc. For example, input through a microphone or other audio device can provide input or commands for one or more applications or functions of device 1100. Additionally, audio output can be provided instead of, or in addition to display output. In another example, if display 1122 includes a touch screen, display 1122 also acts as an input device, which can be at least partially managed by control hub 1132. There can also be additional buttons or switches on computing device 1100 to provide I/O functions managed by control hub 1132. In one embodiment, control hub 1132 manages devices such as accelerometers, cameras, light sensors or other environmental sensors, or other hardware that can be included in device 1100. The input can be part of direct user interaction, as well as providing environmental input to the system to influence its operations (such as filtering for noise, adjusting displays for brightness detection, applying a flash for a camera, or other features).

In some embodiments, control hub 1132 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 1122 represents hardware (e.g., display devices) and software (e.g., drivers) components that provide a visual and/or tactile display for a user to interact with device 1100. Display 1122 may include a display interface, a display screen, and/or hardware device used to provide a display to a user. In some embodiments, display 1122 includes a touch screen (or touch pad) device that provides both output and input to a user. In an example, display 1122 may communicate directly with the processor 1104. Display 1122 can be one or more of an internal display device, as in a mobile electronic device or a laptop device or an external display device attached via a display interface (e.g., DisplayPort, etc.). In one embodiment display 1122 can be a head mounted display (HMD) such as a stereoscopic display device for use in virtual reality (VR) applications or augmented reality (AR) applications.

In some embodiments and although not illustrated in the figure, in addition to (or instead of) processor 1104, device

1100 may include Graphics Processing Unit (GPU) comprising one or more graphics processing cores, which may control one or more aspects of displaying contents on display 1122.

Control hub 1132 (or platform controller hub) may include hardware interfaces and connectors, as well as software components (e.g., drivers, protocol stacks) to make peripheral connections, e.g., to peripheral devices 1124.

It will be understood that device 1100 could both be a peripheral device to other computing devices, as well as have peripheral devices connected to it. Device 1100 may have a "docking" connector to connect to other computing devices for purposes such as managing (e.g., downloading and/or uploading, changing, synchronizing) content on device 1100. Additionally, a docking connector can allow device 1100 to connect to certain peripherals that allow computing device 1100 to control content output, for example, to audiovisual or other systems.

In addition to a proprietary docking connector or other proprietary connection hardware, device 1100 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 1131 may be coupled to control hub 1132, e.g., in addition to, or instead of, being coupled directly to the processor 1104. In some embodiments, display 1122 may be coupled to control hub 1132, e.g., in addition to, or instead of, being coupled directly to processor 1104.

In some embodiments, device 1100 comprises memory 1130 coupled to processor 1104 via memory interface 1134. Memory 1130 includes memory devices for storing information in device 1100. Memory can include nonvolatile (state does not change if power to the memory device is interrupted) and/or volatile (state is indeterminate if power to the memory device is interrupted) memory devices. Memory device 1130 can be a dynamic random access memory (DRAM) device, a static random access memory (SRAM) device, flash memory device, phase-change memory device, or some other memory device having suitable performance to serve as process memory. In one embodiment, memory 1130 can operate as system memory for device 1100, to store data and instructions for use when the one or more processors 1104 executes an application or process. Memory 1130 can store application data, user data, music, photos, documents, or other data, as well as system data (whether long-term or temporary) related to the execution of the applications and functions of device 1100.

Elements of various embodiments and examples are also provided as a machine-readable medium (e.g., memory 1130) for storing the computer-executable instructions (e.g., instructions to implement any other processes discussed herein). The machine-readable medium (e.g., memory 1130) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 1100 comprises temperature measurement circuitries 1140, e.g., for measuring temperature of various components of device 1100. In an example, temperature measurement circuitries 1140 may be embedded, or coupled or attached to various components, whose temperature are to be measured and monitored. For example, temperature measurement circuitries 1140 may measure temperature of (or within) one or more of cores 1108a, 1108b, 1108c, voltage regulator 1114, memory 1130, a mother-board of SOC 1101, and/or any appropriate component of device 1100.

In some embodiments, device 1100 comprises power measurement circuitries 1142, e.g., for measuring power consumed by one or more components of the device 1100. In an example, in addition to, or instead of, measuring power, the power measurement circuitries 1142 may measure voltage and/or current. In an example, the power measurement circuitries 1142 may be embedded, or coupled or attached to various components, whose power, voltage, and/or current consumption are to be measured and monitored. For example, power measurement circuitries 1142 may measure power, current and/or voltage supplied by one or more voltage regulators 1114, power supplied to SOC 1101, power supplied to device 1100, power consumed by processor 1104 (or any other component) of device 1100, etc.

In some embodiments, device 1100 comprises one or more voltage regulator circuitries, generally referred to as voltage regulator (VR) 1114. VR 1114 generates signals at appropriate voltage levels, which may be supplied to operate any appropriate components of the device 1100. Merely as an example, VR 1114 is illustrated to be supplying signals to processor 1104 of device 1100. In some embodiments, VR 1114 receives one or more Voltage Identification (VID) signals, and generates the voltage signal at an appropriate level, based on the VID signals. Various type of VRs may be utilized for the VR 1114. For example, VR 1114 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 1110a/b and/or PMIC 1112. In some embodiments, each core has a network of distributed LDOs to provide efficient control for power management. The LDOs can be digital, analog, or a combination of digital or analog LDOs.

In some embodiments, device 1100 comprises one or more clock generator circuitries, generally referred to as clock generator 1116. Clock generator 1116 generates clock signals at appropriate frequency levels, which may be supplied to any appropriate components of device 1100. Merely as an example, clock generator 1116 is illustrated to be supplying clock signals to processor 1104 of device 1100. In some embodiments, clock generator 1116 receives one or more Frequency Identification (FID) signals, and generates the clock signals at an appropriate frequency, based on the FID signals.

In some embodiments, device 1100 comprises battery 1118 supplying power to various components of device 1100. Merely as an example, battery 1118 is illustrated to be supplying power to processor 1104. Although not illustrated in the figures, device 1100 may comprise a charging circuitry, e.g., to recharge the battery, based on Alternating Current (AC) power supply received from an AC adapter.

In some embodiments, device 1100 comprises Power Control Unit (PCU) 1110 (also referred to as Power Management Unit (PMU), Power Controller, etc.). In an example, some sections of PCU 1110 may be implemented by one or more processing cores 1108, and these sections of PCU 1110 are symbolically illustrated using a dotted box and labelled PCU 1110a. In an example, some other sections of PCU 1110 may be implemented outside the processing cores 1108, and these sections of PCU 1110 are symbolically illustrated using a dotted box and labelled as PCU 1110b. PCU 1110 may implement various power management operations for device 1100. PCU 1110 may include hardware interfaces, hardware circuitries, connectors, registers, etc., as well as software components (e.g., drivers, protocol stacks), to implement various power management operations for device 1100.

In some embodiments, device 1100 comprises Power Management Integrated Circuit (PMIC) 1112, e.g., to implement various power management operations for device 1100. In some embodiments, PMIC 1112 is a Reconfigurable Power Management ICs (RPMICs) and/or an IMVP (Intel® Mobile Voltage Positioning). In an example, the PMIC is within an IC chip separate from processor 1104. The may implement various power management operations for device 1100. PMIC 1112 may include hardware interfaces, hardware circuitries, connectors, registers, etc., as well as software components (e.g., drivers, protocol stacks), to implement various power management operations for device 1100.

In an example, device 1100 comprises one or both PCU 1110 or PMIC 1112. In an example, any one of PCU 1110 or PMIC 1112 may be absent in device 1100, and hence, these components are illustrated using dotted lines.

Various power management operations of device 1100 may be performed by PCU 1110, by PMIC 1112, or by a combination of PCU 1110 and PMIC 1112. For example, PCU 1110 and/or PMIC 1112 may select a power state (e.g., P-state) for various components of device 1100. For example, PCU 1110 and/or PMIC 1112 may select a power state (e.g., in accordance with the ACPI (Advanced Configuration and Power Interface) specification) for various components of device 1100. Merely as an example, PCU 1110 and/or PMIC 1112 may cause various components of the device 1100 to transition to a sleep state, to an active state, to an appropriate C state (e.g., C0 state, or another appropriate C state, in accordance with the ACPI specification), etc. In an example, PCU 1110 and/or PMIC 1112 may control a voltage output by VR 1114 and/or a frequency of a clock signal output by the clock generator, e.g., by outputting the VID signal and/or the FID signal, respectively. In an example, PCU 1110 and/or PMIC 1112 may control battery power usage, charging of battery 1118, and features related to power saving operation.

The clock generator 1116 can comprise a phase locked loop (PLL), frequency locked loop (FLL), or any suitable clock source. In some embodiments, each core of processor 1104 has its own clock source. As such, each core can operate at a frequency independent of the frequency of operation of the other core. In some embodiments, PCU 1110 and/or PMIC 1112 performs adaptive or dynamic frequency scaling or adjustment. For example, clock frequency of a processor core can be increased if the core is not operating at its maximum power consumption threshold or limit. In some embodiments, PCU 1110 and/or PMIC 1112 determines the operating condition of each core of a processor, and opportunistically adjusts frequency and/or power supply voltage of that core without the core clocking source (e.g., PLL of that core) losing lock when the PCU 1110 and/or PMIC 1112 determines that the core is operating below a target performance level. For example, if a core is drawing current from a power supply rail less than a total current allocated for that core or processor 1104, then PCU 1110 and/or PMIC 1112 can temporarily increase the power draw for that core or processor 1104 (e.g., by increasing clock frequency and/or power supply voltage level) so that the core or processor 1104 can perform at a higher performance level. As such, voltage and/or frequency can be increased temporarily for processor 1104 without violating product reliability.

In an example, PCU 1110 and/or PMIC 1112 may perform power management operations, e.g., based at least in part on receiving measurements from power measurement circuitries 1142, temperature measurement circuitries 1140, charge level of battery 1118, and/or any other appropriate information that may be used for power management. To that end, PMIC 1112 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 1110 and/or PMIC 1112 in at least one embodiment to allow PCU 1110 and/or PMIC 1112 to manage processor core energy at least in part based on value(s) detected by one or more of the sensors.

Also illustrated is an example software stack of device 1100 (although not all elements of the software stack are illustrated). Merely as an example, processors 1104 may execute application programs 1150, Operating System 1152, one or more Power Management (PM) specific application programs (e.g., generically referred to as PM applications 1158), and/or the like. PM applications 1158 may also be executed by the PCU 1110 and/or PMIC 1112. OS 1152 may also include one or more PM applications 1156a, 1156b, 1156c. The OS 1152 may also include various drivers 1154a, 1154b, 1154c, etc., some of which may be specific for power management purposes. In some embodiments, device 1100 may further comprise a Basic Input/Output System (BIOS) 1120. BIOS 1120 may communicate with OS 1152 (e.g., via one or more drivers 1154), communicate with processors 1104, etc.

For example, one or more of PM applications 1158, 1156, drivers 1154, BIOS 1120, etc. may be used to implement power management specific tasks, e.g., to control voltage and/or frequency of various components of device 1100, to control wake-up state, sleep state, and/or any other appropriate power state of various components of device 1100, control battery power usage, charging of the battery 1118, features related to power saving operation, etc.

In various embodiments, device 1100 facilitates functionality to provide or otherwise determine a mode according to which a controller is to operate a SCVR. By way of illustration and not limitation, such functionality is provided with one or more of power measurement circuitries 1142, PMIC 1112, PCU 1110a, PCU 1110b or any other suitable resource of device 1100. In one such embodiment, the mode is to provide a boost voltage regulation with the SCVR. Additionally or alternatively, such functionality of device 1100 is to determine a transition of the controller from a first mode, for one type of switched operation of the SCVR, to a second mode for a different type of switched operation of the SCVR—e.g., wherein said mode transition is seamless and (for example) autonomous. In some embodiments, such functionality of device 1100 is to select from among multiple available modes which (for example) include a buck mode, a boost mode, and one or more turbo modes.

In the description herein, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry to determine a mode of voltage regulation with a SCVR.

Techniques and architectures for determining a regulation of a voltage are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

In one or more first embodiments, a voltage regulator (VR) comprises a switched-capacitor (SC) voltage converter comprising multiple buses, and multiple cores each coupled to the multiple buses, wherein a first core of the multiple cores comprises a capacitor, a first switch network comprising first switch circuits each coupled between a first terminal of the capacitor and a different respective one of the multiple buses, and a second switch network comprising second switch circuits each coupled between a second terminal of the capacitor and a different respective one of the multiple buses, and a controller coupled to the SC voltage converter, the controller comprising first circuitry to operate the SC voltage converter according to any of the multiple modes which each correspond to a different respective sequence of switch states of the first core, wherein the multiple modes comprises a mode to provide a boost voltage regulation with the SC voltage converter.

In one or more second embodiments, further to the first embodiment, the multiple buses comprise a first bus to receive a first input voltage, a second bus to receive a second input voltage which is less than the first input voltage, a third bus to provide an output voltage based on the first input voltage and the second input voltage, and a first plurality of buses, and wherein the mode to provide the boost voltage regulation corresponds to a first sequence of switch states, wherein the first sequence comprises first successive switch states, and wherein the third bus and the first plurality of buses are coupled to the first bus, via the first switch network, via the second switch network and via the capacitor, each during a different respective switch state of the first successive switch states.

In one or more third embodiments, further to the second embodiment, the multiple buses further comprise a second plurality of buses, wherein the first sequence further comprises second successive switch states after the first successive switch states, and wherein the second bus and the second plurality of buses are coupled to the first bus, via the first switch network, via the second switch network and via the capacitor, each during a different respective switch state of the second successive switch states.

In one or more fourth embodiments, further to the third embodiment, the first sequence further comprises third successive switch states after the second successive switch states, and wherein the first plurality of buses are coupled to the second bus, via the first switch network, via the second switch network and via the capacitor, each during a different respective switch state of the third successive switch states.

In one or more fifth embodiments, further to the fourth embodiment, the first sequence further comprises fourth successive switch states after the third successive switch states, and wherein the second plurality of buses are coupled to the third bus, via the first switch network, via the second switch network and via the capacitor, each during a different respective switch state of the fourth successive switch states.

In one or more sixth embodiments, further to the first embodiment or the second embodiment, the multiple buses comprise a first bus to receive a first input voltage, a second bus to receive a second input voltage which is less than the first input voltage, and a third bus to provide an output voltage based on the first input voltage and the second input voltage, and wherein the controller is further to signal the SC voltage converter to provide a bypass state with the first switch network and the second switch network, wherein, during the bypass state a first conductive path is provided with two switch circuits of the first switch network, wherein the first conductive path extends to each of the first bus, the third bus, and the first terminal, and a second conductive path is provided with one switch circuit of the second switch network, wherein the second conductive path extends to each of the second bus, and the second terminal.

In one or more seventh embodiments, further to the first embodiment or the second embodiment, the multiple modes further comprise two or more modes which are each to provide a different respective total number of switch states.

In one or more eighth embodiments, further to the first embodiment or the second embodiment, the controller further comprises second circuitry, coupled to the first circuitry, to receive a signal which identifies one of a first mode of the multiple modes, or a second mode of the multiple modes, wherein the first mode corresponds to a first sequence of switch states, and wherein the second mode corresponds to a second sequence of switch states, based on the signal, identify both a predetermined first reference switch state of the first sequence, and a predetermined second reference switch state of the second sequence, and transition the first circuitry between the first mode and the second mode based on the first reference switch state and on the second reference switch state.

In one or more ninth embodiments, further to the eighth embodiment, the second circuitry to transition the first circuitry between the first mode and the second mode comprises the second circuitry to signal the first circuitry to provide a switch state of the second sequence as a next switch state after the first reference switch state.

In one or more tenth embodiments, further to the ninth embodiment, the second circuitry is to signal the first circuitry to provide the second reference switch state as a next switch state after the first reference switch state.

In one or more eleventh embodiments, a voltage regulator (VR) comprises a switched-capacitor (SC) voltage converter comprising multiple buses, and multiple cores each coupled to the multiple buses, wherein a first core of the multiple cores comprises a capacitor, and a first switch network comprising first switch circuits each coupled between a first terminal of the capacitor and a different respective one of the multiple buses, first circuitry coupled to operate the SC voltage converter according to any of the multiple modes which each correspond to a different respective sequence of switch states of the first core, and second circuitry, coupled to the first circuitry, to receive a signal which identifies one of a first mode or a second mode, wherein the first mode and the second mode correspond, respectively to a first sequence of switch states, and a second sequence of switch states, based on the signal, identify a predetermined first reference switch state of the first sequence, and a predetermined second reference switch state of the second sequence, and transition the first circuitry between the first mode and the second mode based on the first reference switch state and on the second reference switch state.

In one or more twelfth embodiments, further to the eleventh embodiment, the second circuitry to transition the first circuitry between the first mode and the second mode comprises the second circuitry to signal the first circuitry to provide a switch state of the second sequence as a next switch state after the first reference switch state.

In one or more thirteenth embodiments, further to the twelfth embodiment, the second circuitry is to signal the first circuitry to provide the second reference switch state as a next switch state after the first reference switch state.

In one or more fourteenth embodiments, further to the eleventh embodiment or the twelfth embodiment, the multiple modes comprise a mode to provide a boost voltage regulation with the SC voltage converter.

In one or more fifteenth embodiments, further to the fourteenth embodiment, the multiple buses comprise a first bus to receive a first input voltage, a second bus to receive a second input voltage which is less than the first input voltage, a third bus to provide an output voltage based on the first input voltage and the second input voltage, and a first plurality of buses, and wherein the mode to provide the boost voltage regulation corresponds to a first sequence of switch states, wherein the first sequence comprises first successive switch states, and wherein the third bus and the first plurality of buses are coupled to the first bus, via the first switch network, via the second switch network and via the capacitor, each during a different respective switch state of the first successive switch states.

In one or more sixteenth embodiments, further to the fifteenth embodiment, the multiple buses further comprise a second plurality of buses, wherein the first sequence further comprises second successive switch states after the first successive switch states, and wherein the second bus and the second plurality of buses are coupled to the first bus, via the first switch network, via the second switch network and via the capacitor, each during a different respective switch state of the second successive switch states.

In one or more seventeenth embodiments, further to the sixteenth embodiment, the first sequence further comprises third successive switch states after the second successive switch states, and wherein the first plurality of buses are coupled to the second bus, via the first switch network, via the second switch network and via the capacitor, each during a different respective switch state of the third successive switch states.

In one or more eighteenth embodiments, further to the seventeenth embodiment, the first sequence further comprises fourth successive switch states after the third successive switch states, and wherein the second plurality of buses are coupled to the third bus, via the first switch network, via the second switch network and via the capacitor, each during a different respective switch state of the fourth successive switch states.

In one or more nineteenth embodiments, further to the eleventh embodiment or the twelfth embodiment, the multiple modes comprise two or more modes which are each to provide a different respective total number of switch states.

In one or more twentieth embodiments, further to the eleventh embodiment or the twelfth embodiment, the SC voltage converter is to continuously provide an output voltage during the transition between the first mode and the second mode.

In one or more twenty-first embodiments, further to the eleventh embodiment or the twelfth embodiment, the second circuitry is to automatically transition the first circuitry between the first mode and the second mode based on a detected change to a power demand by a load circuit.

In one or more twenty-second embodiments, a current sensor comprises a detector unit to detect an output voltage from a voltage regulator, the detector unit comprising circuitry to generate, based on the output voltage, a first signal which identifies a rate of switch events by the voltage regulator, and an evaluation unit coupled to receive the first signal from the detector unit, wherein the evaluation unit comprises circuitry to generate a second signal based on both the rate of switch events, and reference information previously provided to the evaluation unit, wherein the second signal identifies an amount of a current conducted with the voltage regulator, and wherein the reference information indicates a function according to which the current varies based on one or more operational characteristics of the voltage regulator.

In one or more twenty-third embodiments, further to the twenty-second embodiment, the evaluation unit is to further receive the output voltage and an input voltage which is provided to the voltage regulator, wherein the evaluation unit is to generate the second signal further based on both the output voltage and the input voltage.

In one or more twenty-fourth embodiments, further to the twenty-third embodiment, the evaluation unit comprises a lookup table to store the reference information, and the evaluation unit to generate the second signal comprises the evaluation unit to perform a search of the lookup table based on the first signal.

In one or more twenty-fifth embodiments, further to the twenty-third embodiment, the reference information comprises one or more parameters of an equation, and the evaluation unit to generate the second signal comprises the evaluation unit to perform an evaluation of the equation based on the rate of switch events and the one or more parameters.

In one or more twenty-sixth embodiments, further to the twenty-second embodiment or the twenty-third embodiment, the function comprises a product of each of the rate of switch events, a capacitance of the voltage regulator, and a value which is based on each of the input voltage, the output voltage, a predetermined rate of change of the current with the input voltage, and a predetermined rate of change of the current with the output voltage.

In one or more twenty-seventh embodiments, further to the twenty-second embodiment or the twenty-third embodiment, the detector unit comprises a comparator circuit to receive the output voltage and a reference voltage, and to provide a third signal which indicates a difference between the reference voltage and the output voltage, and a pulse counter coupled to receive the third signal from the comparator circuit, and to generate the first signal based on the third signal and a reference periodic signal.

In one or more twenty-eighth embodiments, further to the twenty-second embodiment or the twenty-third embodiment, the voltage regulator comprises a switched-capacitor voltage regulator.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A voltage regulator (VR) comprising:
   a switched-capacitor (SC) voltage converter comprising multiple buses, and multiple cores each coupled to the multiple buses, wherein a first core of the multiple cores comprises:
   a capacitor;
   a first switch network comprising first switch circuits each coupled between a first terminal of the capacitor and a first one of the multiple buses; and
   a second switch network comprising second switch circuits each coupled between a second terminal of the capacitor and a different second one of the multiple buses; and
   a controller coupled to the SC voltage converter, the controller comprising first circuitry to operate the SC voltage converter according to any of two or more multiple different modes which each correspond to a different sequence of switch states of the first and second switch networks, wherein the two or more multiple different modes comprise a boost mode to provide a boost voltage regulation with the SC voltage converter, wherein the multiple buses comprise (i) a first bus to receive a first input voltage, (ii) a second bus to receive a second input voltage which is less than the first input voltage, and (iii) a third bus to provide an output voltage based on the first input voltage and the second input voltage, wherein the controller is further to signal the SC voltage converter to provide a bypass mode with the first switch network and the second switch network and wherein, during the bypass mode (i) a first conductive path is provided with two switch circuits of the first switch network, the first conductive path extending to each of the first bus, the third bus, and the first terminal; and (ii) a second conductive path is provided with one switch circuit of the second switch network, the second conductive path extending to each of the second bus and the second terminal.

2. The VR of claim 1, wherein the multiple buses comprise:
   a first bus to receive a first input voltage;
   a second bus to receive a second input voltage which is less than the first input voltage;
   a third bus to provide an output voltage based on the first input voltage and the second input voltage;
   a first plurality of buses; and
   wherein the mode to provide the boost voltage regulation corresponds to a first sequence of switch states;
   wherein the first sequence comprises first successive switch states; and
   wherein the third bus and the first plurality of buses are coupled to the first bus, via the first switch network, via the second switch network and via the capacitor, each during a different respective switch state of the first successive switch states.

3. The VR of claim 2, wherein the multiple buses further comprise a second plurality of buses;
   wherein the first sequence further comprises second successive switch states after the first successive switch states; and
   wherein the second bus and the second plurality of buses are coupled to the first bus, via the first switch network, via the second switch network and via the capacitor, each during a different respective switch state of the second successive switch states.

4. The VR of claim 3, wherein the first sequence further comprises third successive switch states after the second successive switch states; and
wherein the first plurality of buses are coupled to the second bus, via the first switch network, via the second switch network and via the capacitor, each during a different respective switch state of the third successive switch states.

5. The VR of claim 4, wherein the first sequence further comprises fourth successive switch states after the third successive switch states; and
wherein the second plurality of buses are coupled to the third bus, via the first switch network, via the second switch network and via the capacitor, each during a different respective switch state of the fourth successive switch states.

6. The VR of claim 1, wherein the multiple modes further comprise two or more modes which are each to provide a different respective total number of switch states.

7. The VR of claim 1, wherein the controller further comprises second circuitry, coupled to the first circuitry, to:
receive a signal which identifies one of a first mode of the multiple modes, or a second mode of the multiple modes, wherein the first mode corresponds to a first sequence of switch states, and wherein the second mode corresponds to a second sequence of switch states;
based on the signal, identify both a predetermined first reference switch state of the first sequence, and a predetermined second reference switch state of the second sequence; and
transition the first circuitry between the first mode and the second mode based on the first reference switch state and on the second reference switch state.

8. The VR of claim 7, wherein the second circuitry to transition the first circuitry between the first mode and the second mode comprises the second circuitry to signal the first circuitry to provide a switch state of the second sequence as a next switch state after the first reference switch state.

9. A voltage regulator (VR) comprising:
a switched-capacitor (SC) voltage converter comprising multiple buses, and multiple cores each coupled to the multiple buses, wherein a first core of the multiple cores comprises a capacitor, and a first switch network comprising first switch circuits each coupled between a first terminal of the capacitor and a different respective one of the multiple buses;
first circuitry coupled to operate the SC voltage converter according to any of a plurality of multiple modes which each correspond to a different respective sequence of switch states of the first switch network; and
second circuitry, coupled to the first circuitry, to:
receive a signal which identifies one of a first mode or a second mode, wherein the first mode and the second mode correspond, respectively to a first sequence of switch states for the first switch network, and a second sequence of switch states for the first switch network;
based on the signal, identify a predetermined first reference switch state of the first sequence, and a predetermined second reference switch state of the second sequence; and
transition the first circuitry between the first mode and the second mode based on the first reference switch state and on the second reference switch state.

10. The VR of claim 9, wherein the second circuitry to transition the first circuitry between the first mode and the second mode comprises the second circuitry to signal the first circuitry to provide a switch state of the second sequence as a next switch state after the first reference switch state.

11. The VR of claim 9, wherein the multiple modes comprise a mode to provide a boost voltage regulation with the SC voltage converter.

12. The VR of claim 11, wherein the multiple buses comprise:
a first bus to receive a first input voltage;
a second bus to receive a second input voltage which is less than the first input voltage;
a third bus to provide an output voltage based on the first input voltage and the second input voltage; and
a first plurality of buses; and
wherein the mode to provide the boost voltage regulation corresponds to the first sequence of switch states;
wherein the first sequence comprises first successive switch states; and
wherein the third bus and the first plurality of buses are coupled to the first bus, via the first switch network, via the second switch network and via the capacitor, each during a different respective switch state of the first successive switch states.

13. The VR of claim 9, wherein the multiple modes comprise two or more modes which are each to provide a different respective total number of switch states.

14. A current sensor comprising:
a detector unit to detect an output voltage from a voltage regulator, the detector unit comprising circuitry to generate, based on the output voltage, a first signal which identifies a rate of switch events by the voltage regulator; and
an evaluation unit coupled to receive the first signal from the detector unit, wherein the evaluation unit comprises circuitry to generate a second signal based on both the rate of switch events, and reference information previously provided to the evaluation unit, wherein the second signal identifies an amount of a current conducted with the voltage regulator, and wherein the reference information indicates a function according to which the second signal varies based on one or more operational characteristics of the voltage regulator, wherein the detector unit comprises (i) a comparator circuit to receive the output voltage and a reference voltage, and to provide a third signal which indicates a difference between the reference voltage and the output voltage; and (iij) a pulse counter coupled to receive the third signal from the comparator circuit, and to generate the first signal based on the third signal and a reference periodic signal.

15. The current sensor of claim 14, wherein the evaluation unit is to further receive the output voltage and an input voltage which is provided to the voltage regulator, wherein the evaluation unit is to generate the second signal further based on both the output voltage and the input voltage.

16. The current sensor of claim 15, wherein:
the evaluation unit comprises a lookup table to store the reference information; and
the evaluation unit to generate the second signal comprises the evaluation unit to perform a search of the lookup table based on the first signal.

17. The current sensor of claim 14, wherein the function comprises a product of each of:
the rate of switch events;
a capacitance of the voltage regulator; and
a value which is based on each of:
the input voltage;
the output voltage;
a predetermined rate of change of the current with the input voltage; and
a predetermined rate of change of the current with the output voltage.

18. The current sensor of claim 14, wherein the voltage regulator comprises a switched-capacitor voltage regulator.

* * * * *